(12) United States Patent
Sharma et al.

(10) Patent No.: US 12,453,123 B2
(45) Date of Patent: Oct. 21, 2025

(54) TRANSISTOR WITH FRONT-SIDE AND BACK-SIDE CONTACTS AND ROUTING

(71) Applicant: Intel Corporation, Santa Clara, CA (US)

(72) Inventors: Abhishek A. Sharma, Hillsboro, OR (US); Wilfred Gomes, Portland, OR (US); Mauro J. Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 974 days.

(21) Appl. No.: 17/355,384

(22) Filed: Jun. 23, 2021

(65) Prior Publication Data

US 2022/0416034 A1  Dec. 29, 2022

(51) Int. Cl.
| | |
|---|---|
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ..... *H10D 30/6729* (2025.01); *H10D 30/6735* (2025.01); *H10D 30/6757* (2025.01); *H10D 62/118* (2025.01); *H10D 84/0149* (2025.01); *H10D 84/038* (2025.01)

(58) Field of Classification Search
CPC ........... H10D 30/6729; H10D 30/6735; H10D 30/6757; H10D 62/118; H10D 84/0149; H10D 84/038; H10D 84/0188; H10D 84/201; H10D 1/045; H10D 30/015; H02K 15/027; A61K 40/4218; G08G 5/38; A23B 2/783; H10H 20/826; H10H 20/8314; H01L 24/25; H01L 21/76895; H01L 23/5226;
(Continued)

(56) References Cited

U.S. PATENT DOCUMENTS

| | | |
|---|---|---|
| 11,018,264 B1 | 5/2021 | Gomes et al. |
| 2019/0109052 A1* | 4/2019 | Reznicek ........ H01L 21/823431 |
| 2019/0305135 A1* | 10/2019 | Radosavljevic .. H01L 21/02609 |

(Continued)

FOREIGN PATENT DOCUMENTS

WO    2018125024 A1    7/2018

OTHER PUBLICATIONS

Russo, Stefano, and Aldo Di Carlo. "Influence of the source-gate distance on the AlGaN/GaN HEMT performance." IEEE Transactions on Electron Devices 54.5 (2007): 1071-1075. (Year: 2007).*

*Primary Examiner* — Norman D Richards
*Assistant Examiner* — Ethan Edward Cutler
(74) *Attorney, Agent, or Firm* — Akona IP PC

(57) ABSTRACT

Described herein are transistors with front-side and back-side routing, and IC devices including such transistors. The transistor includes a channel material having a longitudinal structure and formed in a dielectric material. A source region encloses a first portion of the channel material, a gate electrode encloses a second portion of the channel material, and a drain region encloses a third portion of the channel material. Each of the source region, gate electrode, and drain region have a first face and a second face opposite the first face, the first and second faces co-planar with the faces of the dielectric material. A first contact is coupled to the first face of the source region, and a second contact is coupled to the second face of the source region.

20 Claims, 15 Drawing Sheets

(58) Field of Classification Search
CPC ... H01L 24/19; H01L 24/20; H01L 2224/215; B82Y 10/00; H10F 77/955; H10F 99/00
See application file for complete search history.

(56) References Cited

U.S. PATENT DOCUMENTS

| | | |
|---|---|---|
| 2020/0035683 A1 | 1/2020 | Sharma et al. |
| 2021/0125990 A1 | 4/2021 | Gomes et al. |
| 2021/0134802 A1 | 5/2021 | Gomes et al. |
| 2021/0193666 A1 | 6/2021 | Gomes et al. |
| 2021/0242322 A1* | 8/2021 | Liang .................... H01L 29/785 |

* cited by examiner

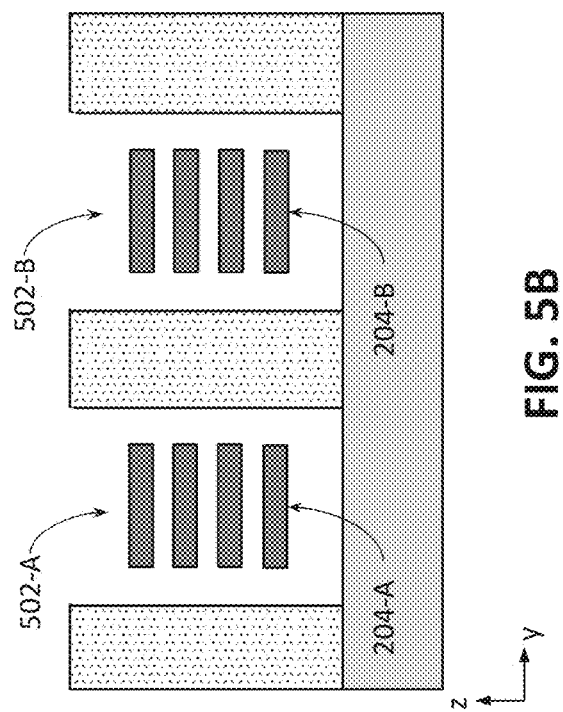
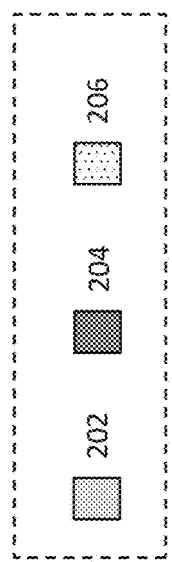
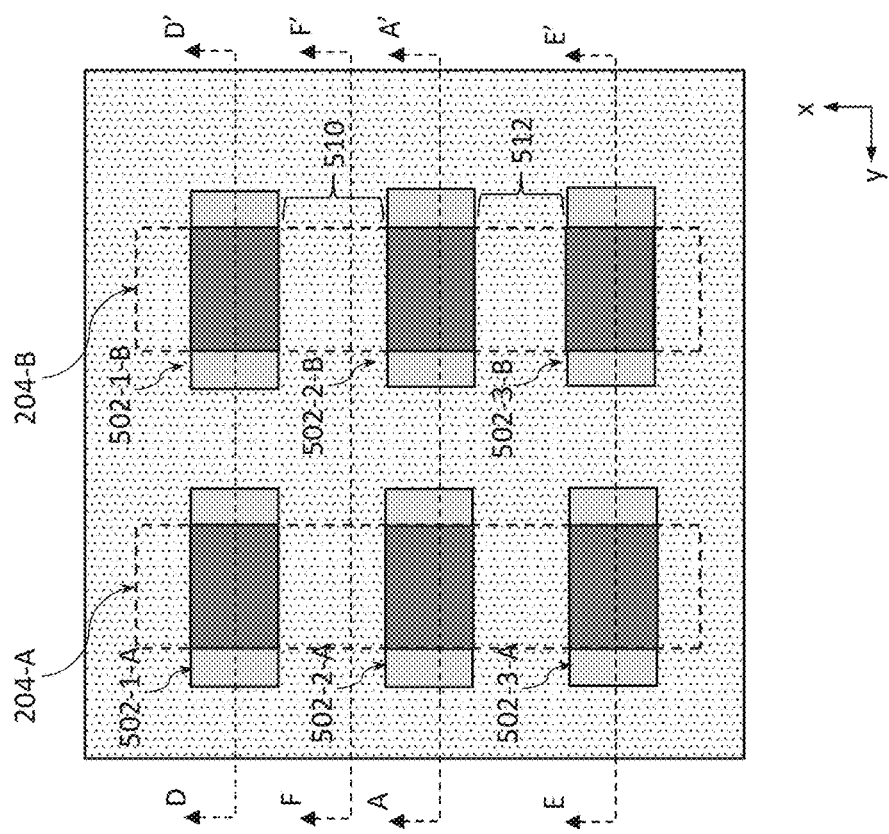
FIG. 5B
FIG. 5A

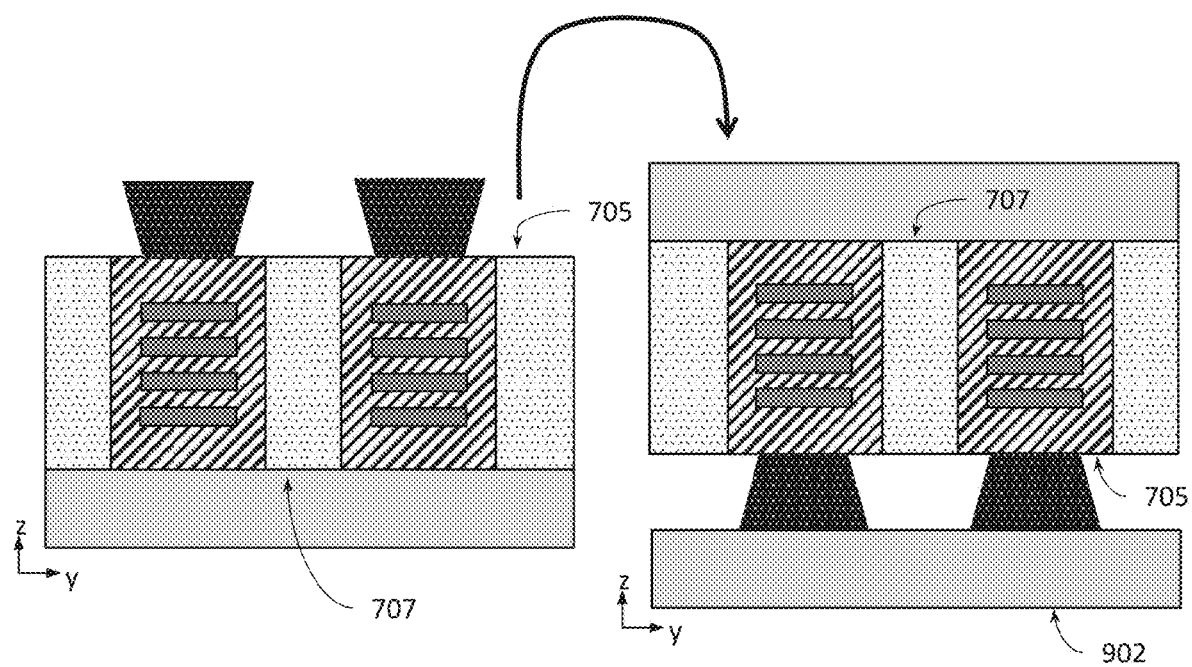
FIG. 9A
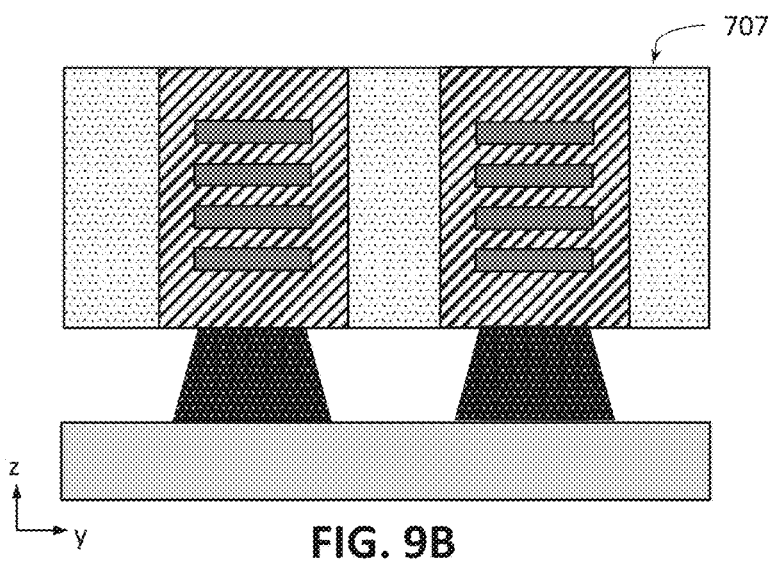
FIG. 9B
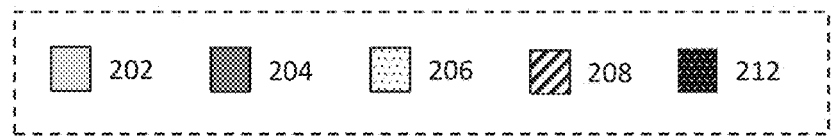

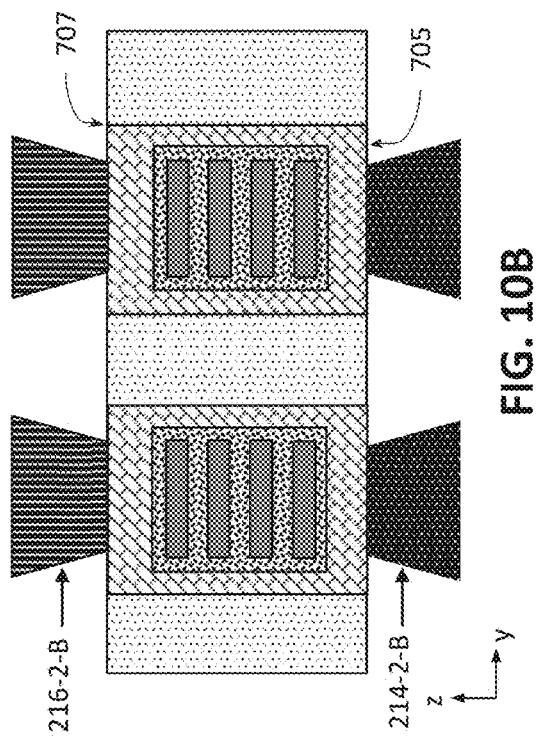
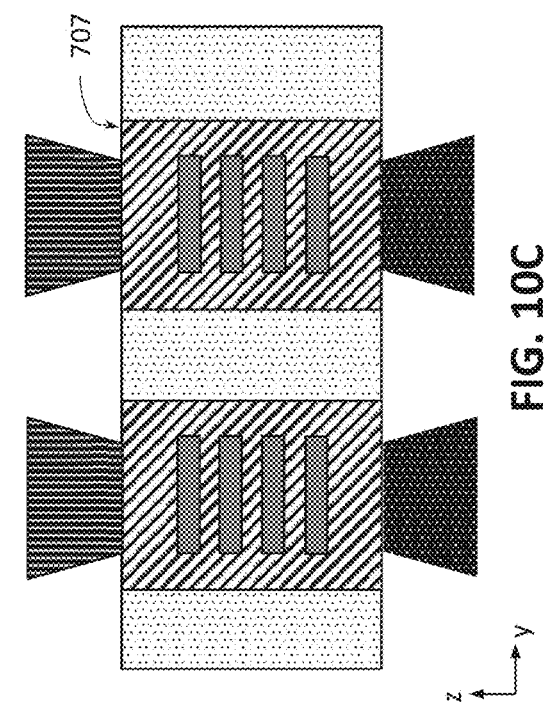
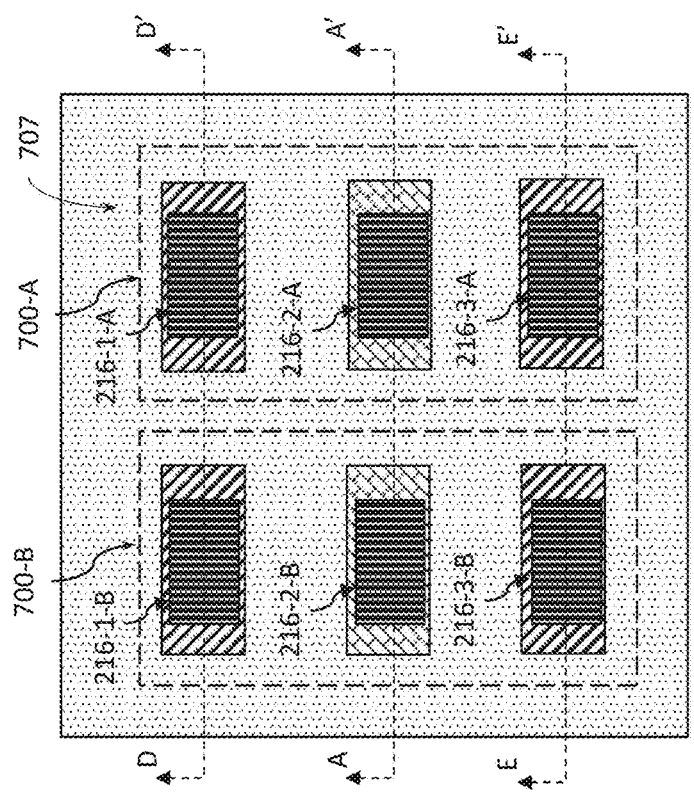
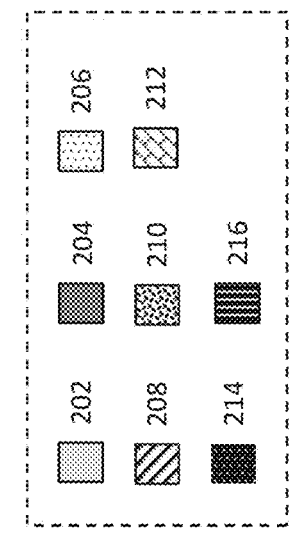
FIG. 10A
FIG. 10B
FIG. 10C

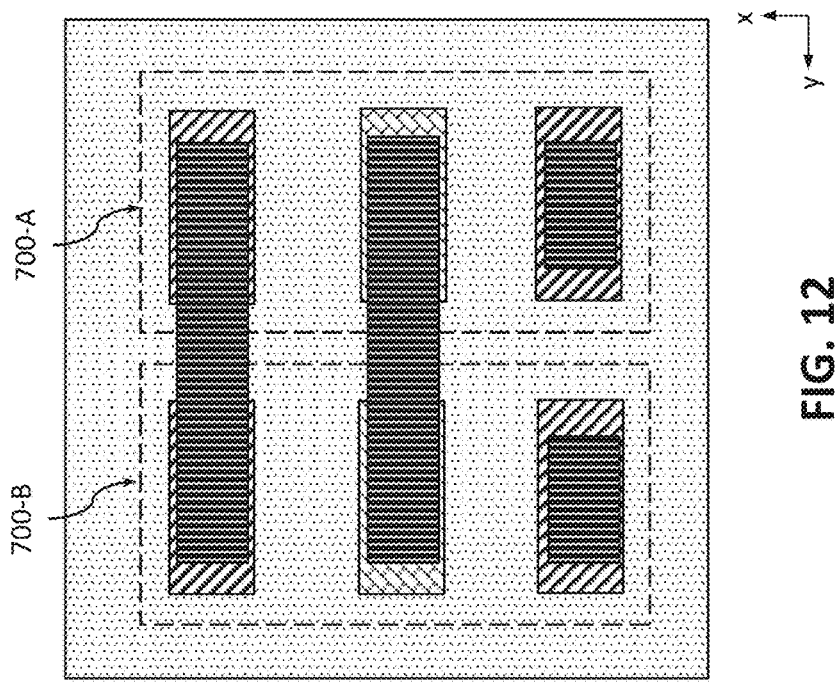
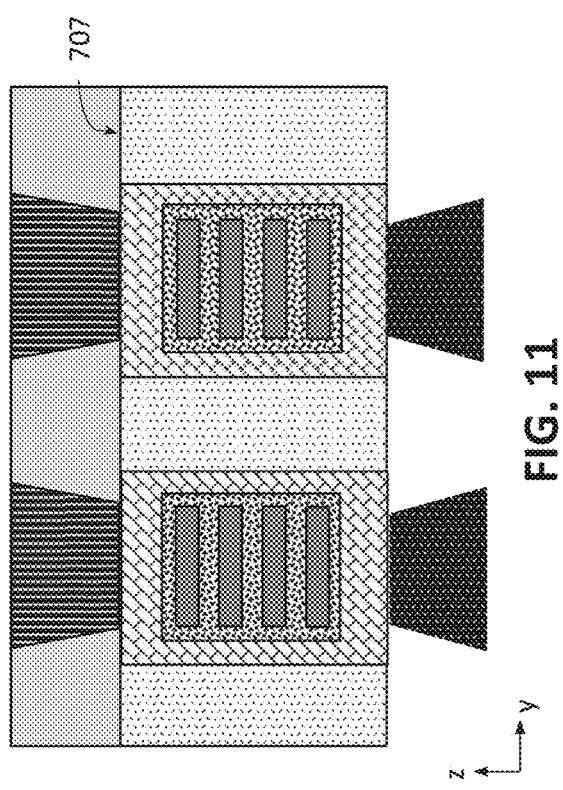
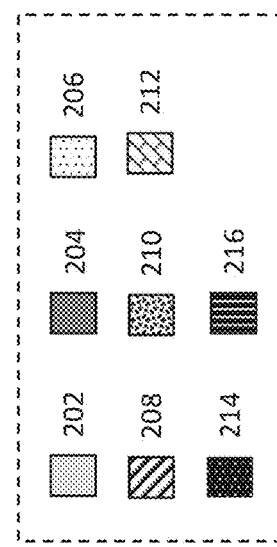
FIG. 12
FIG. 11

TRANSISTOR WITH FRONT-SIDE AND BACK-SIDE CONTACTS AND ROUTING

TECHNICAL FIELD

This disclosure relates generally to the field of integrated circuit (IC) structures and devices, and more specifically, to transistors with front-side and back-side contacts and routing incorporated in such IC structures and devices.

BACKGROUND

Conventional transistors have a channel extending between a source region and a drain region, and a gate over the channel to turn the transistor on or off. The source region and drain region are each coupled to a respective contact that applies a voltage to the region. Similarly, the gate is connected to a contact to apply a current to the gate. In some transistors, the contacts are all on the front-side or top of the device. In some transistors, one or both of the source and drain contacts may be moved to the back-side or bottom of the device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A and 5B show a top view of the channels with portions of dielectric removed and a cross-section along the AA', DD', and EE' planes, according to some embodiments of the present disclosure.

FIGS. 9A and 9B illustrate flipping the transistor and etching the support structure on the back-side of the transistor, according to some embodiments of the present disclosure.

FIGS. 10A-10C show a top view and cross-section views of source, gate, and drain contacts on the back-side of the transistor, according to some embodiments of the present disclosure.

FIG. 11 illustrates a cross-section view of gate contacts formed in a support structure on the back-side of the transistor, according to some embodiments of the present disclosure.

FIG. 12 illustrates an example back-side contact layout for two neighboring transistors, according to some embodiments of the present disclosure.

DETAILED DESCRIPTION

Overview

Figure 1:
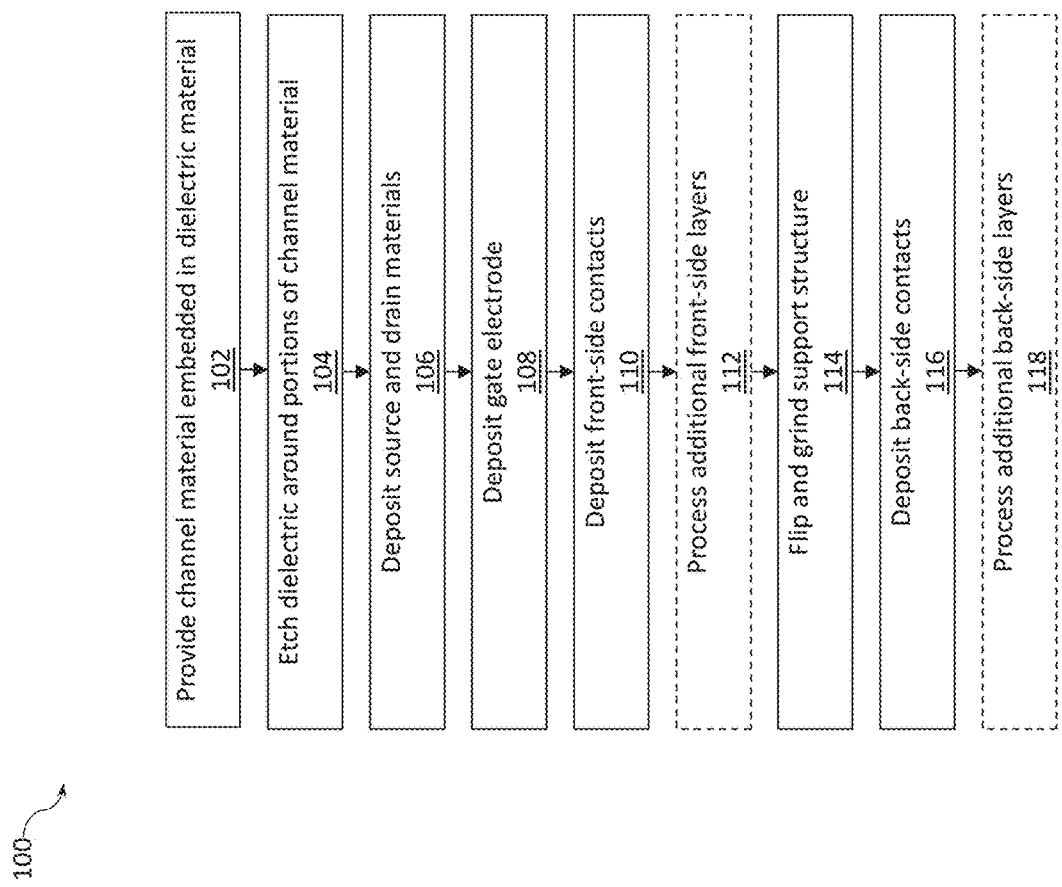
FIG. 1 is a flow diagram of an example method for fabricating a transistor with front-side and back-side contacts, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

In general, a field-effect transistor (FET), e.g., a metal-oxide-semiconductor (MOS) FET (MOSFET), is a three-terminal device that includes source, drain, and gate terminals and uses electric field to control current flowing through the device. A FET typically includes a channel material, a source region and a drain region provided in the channel material, and a gate stack that includes a gate electrode material, alternatively referred to as a "work function" material, provided over a portion of the channel material between the source and the drain regions, and, optionally, also includes a gate dielectric material between the gate electrode material and the channel material.

Conventional FETs are controlled using a source contact that is coupled to the source region, a gate contact that is coupled to the gate stack, and a drain contact that is coupled to the drain region. Each contact can apply a voltage to the respective region, e.g., the source contact applies a voltage to the source region, and the gate contact applies a voltage to the gate stack. Various arrangements for the source, gate, drain, and contacts have been realized. For example, in some prior transistors, the source and drain regions, and the source and drain contacts, are on the front-side of the device; the gate may be on either the front-side or the back-side. In other arrangements, the source and drain regions and contacts are on the back-side of the device. In still other arrangements, the source region and source contact is on the front-side of the device, while the drain region and drain contact are on the back-side of the device, or vice versa; as is commonly known, source and drain terminals are interchangeable in transistors.

In each of these arrangements, the source and drain regions are formed either on or near the front-side of the channel material, or on or near the back-side of the channel material. Furthermore, each region (source, gate, and drain) has one contact for controlling the voltage on the region. In some applications, it is advantageous to have multiple contacts coupled to some or all of the source, gate, and drain, e.g., so that one or more of the transistor regions can be controlled from both sides of the device, i.e., the back-side and the front-side.

Described herein are transistors with front-side and back-side contacts and corresponding methods and devices. The transistor includes a channel material, e.g., a fin-shaped channel material having a longitudinal structure that extends parallel to an upper face of a support structure, e.g., a substrate. The channel material may be embedded in a dielectric material that has a first face and a second face, each of which are parallel to the support structure. A first source or drain (S/D) region encloses one portion of the channel material. The first S/D region has a first face parallel to the support structure, e.g., along the first face of the dielectric material, and a second face opposite the first face, e.g., along the second face of the dielectric material. A gate electrode encloses a second portion of the channel material, and a second S/D region encloses a third portion of the channel material; the gate electrode is between the first and second S/D regions.

The first S/D region has a first S/D contact coupled to its first face, and a second S/D contact coupled to its second face. The first S/D contact may be a front-side contact, and the second S/D contact a back-side contact, or vice versa (depending on the orientation of the device). In some embodiments, both of the first and second S/D regions have two S/D contacts on opposite sides of the transistor. In some embodiments, the gate electrode has two gate contacts on opposite sides of the transistor. In different embodiments, different regions (source, gate, and drain) may each have one or two contacts. For example, in an IC device with many transistors, different transistors may have different contact arrangements. Furthermore, contacts on either side may be coupled to metal routing (e.g., vias and trenches) to additional devices, including on other layers of a multi-layer IC device. For example, a transistor may be coupled to two capacitors, one on either side of the transistor layer. This allows a single transistor to serve as an access transistor for two different memory cells. More generally, enclosing the channel material with two S/D regions and a gate electrode, the transistor can be accessed from both sides, which permits greater flexibility in routing arrangements and control over the transistors.

In some embodiments, the channel material may be in the form of one or more nanoribbons or nanowires. As used herein, the term "nanoribbon" refers to an elongated semiconductor structure having a long axis parallel to a support structure (e.g., a substrate, a chip, or a wafer) over which a transistor arrangement is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular or square-like transverse cross-section. In the present disclosure, the term "nanoribbon" is used to describe both such nanoribbons (including nanosheets) and nanowires, as well as elongated semiconductor structures with a longitudinal axis parallel to the support structures and with having transverse cross-sections of any geometry (e.g., oval, or a polygon with rounded corners).

The transistors with front-side and back-side contacts described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

The drawings are intended to show relative arrangements of the elements therein, and the device assemblies of these figures may include other elements that are not specifically illustrated (e.g., various interfacial layers). Similarly, although particular arrangements of materials are discussed with reference to the drawings, intermediate materials may be included in the devices and assemblies of these drawings. Still further, although some elements of the various device views are illustrated in the drawings as being planar rectangles or formed of rectangular solids and although some schematic illustrations of example structures are shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more non-planar transistor arrangements with asymmetric gate enclosures as described herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "logic state" of a ferroelectric memory cell refers to one of a finite number of states that the cell can have, e.g. logic states "1" and "0," each state represented by a different polarization of the ferroelectric material of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. In yet another example, a "high-k dielectric" refers to a material having a higher dielectric constant (k) than silicon oxide. The terms "oxide," "carbide," "nitride," etc. refer to compounds containing, respectively, oxygen, carbon, nitrogen, etc.

Fabricating Transistors with Front-Side and Back-Side Contacts

FIG. 1 is a flow diagram of an example method 100 for fabricating a transistor with front-side and back-side contacts, according to some embodiments of the present disclosure. FIGS. 2-10 illustrate various stages in the manufacture of an example IC structure according to the fabrication method 100, in accordance with some embodiments.

A number of elements referred to in the description of FIGS. 2-14 with reference numerals are illustrated in these figures with different patterns, with a legend showing the correspondence between the reference numerals and patterns being provided at the bottom of each drawing page containing FIGS. 2-14. For example, the legend illustrates that FIGS. 2-14 use different patterns to show a support structure 202, a channel material 204, and a dielectric material 206. Furthermore, although a certain number of a given element may be illustrated in some of FIGS. 2-14 (e.g., two channels around which two transistors are formed), this is simply for ease of illustration, and more, or less, than that number may be included in an IC structure according to various embodiments of the present disclosure. In general, an IC structure will include many more transistors than illustrated here. Still further, various IC structure views shown in FIGS. 2-14 are intended to show relative arrangements of various elements therein, and that various IC structures, or portions thereof, may include other elements or components that are not illustrated.

Figure 2:
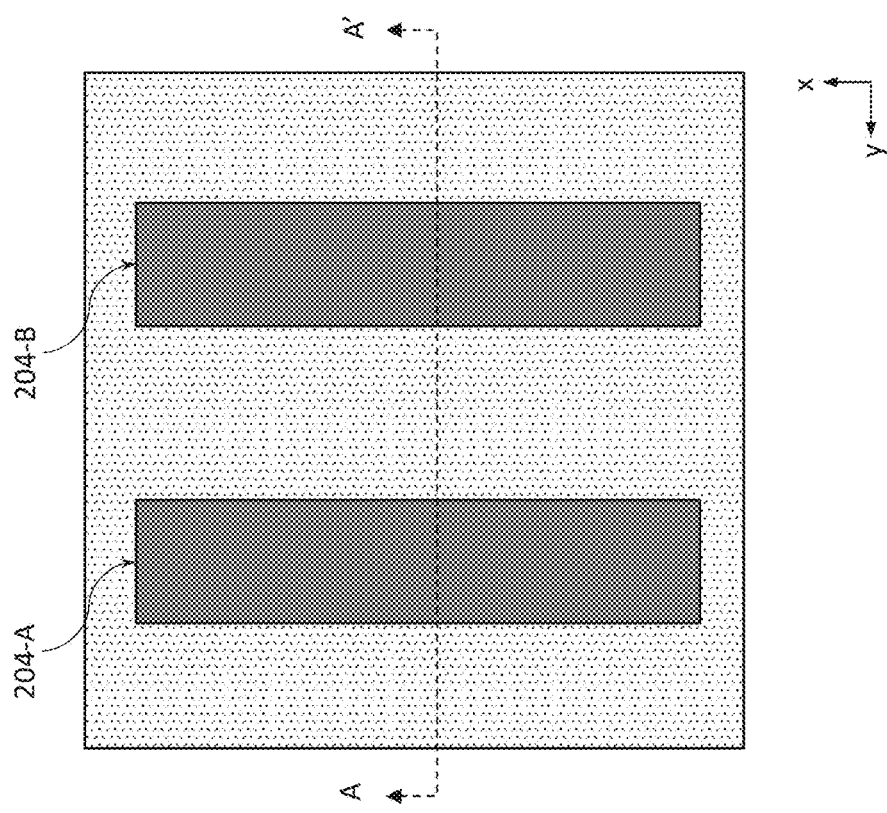
FIG. 2 is a cross-section in the x-y plane showing a pair of channels, according to some embodiments of the present disclosure.
Figure 2:
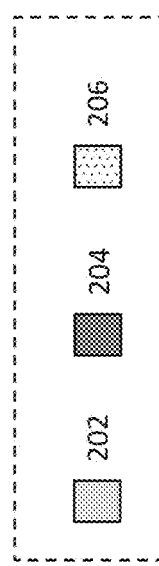

Turning to FIG. 1, the method 100 may begin with a process 102 that includes providing a channel material embedded in a dielectric material. FIG. 2 illustrates a cross-section of a pair of longitudinal channels 204-A and 204-B in an example y-x plane of an exemplary reference coordinate system x-y-z utilized in FIGS. 2-12. The channels 204-A and 204-B are referred to jointly as channel material 204 or simply channels 204. During the method 100, a first transistor is formed around channel 204-A, and a second transistor is formed around channel 204-B. The two channels and two transistors are merely exemplary, and many more transistors may be formed along a single channel and/or along additional channels.

The channel material 204 is embedded in a dielectric material 206. The dielectric material 206 is a support structure for the channel material 204. The channel material 204 has a longitudinal structure, extending in the x-direction in the reference frame of FIG. 2. The dielectric material 206 extends along the x-y plane, so the channel material 204 extends in a direction (e.g., the x-direction) that is parallel to the dielectric material 206.

Figure 3:
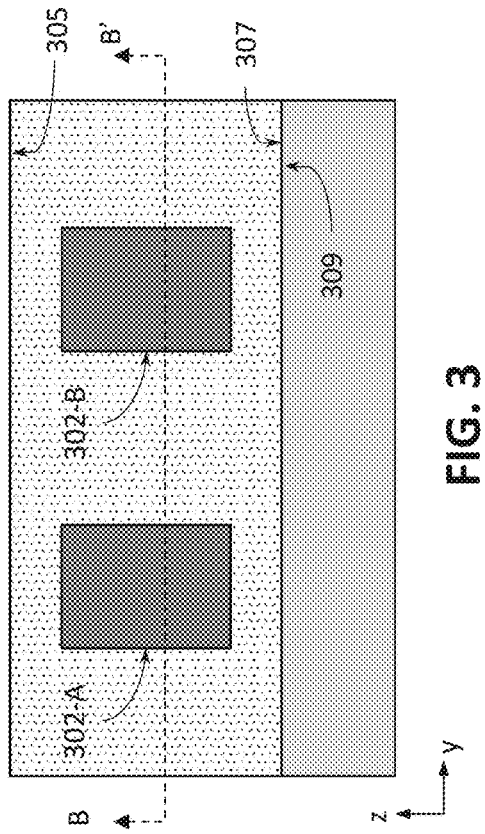
FIG. 3 is a first example cross-section along a plane AA' of the example arrangement shown in FIG. 2, according to some embodiments of the present disclosure.

The dielectric material 206 and channels 204 may be formed over a support structure, e.g., the support structure 202 shown in FIG. 3. FIG. 3 is one example cross-section of FIG. 2 taken through the channel material 204 (e.g., along the plane shown in FIG. 2 as a plane AA'). FIG. 3 shows that the channel material 204 is shaped as fins 302-A and 302-B, referred to jointly as fins 302. The fins 302 are enclosed by the dielectric material 206, which extends over a support structure 202. The fins 302 extend away from the support structure 202 in a direction substantially perpendicular to the support structure 202, i.e., perpendicular to an upper face 309 of the support structure 202 and extending in the z-direction in the exemplary reference coordinate system x-y-z. As noted above, the fins 302 also extend in the x-direction, e.g., into the page in the orientation of FIG. 3, as illustrated in FIG. 2. As noted above, FIG. 2 is a cross-section of the channels 204; for example, FIG. 2 is a cross-section taken along the plane shown in FIG. 3 as plane BB'.

Figure 4:
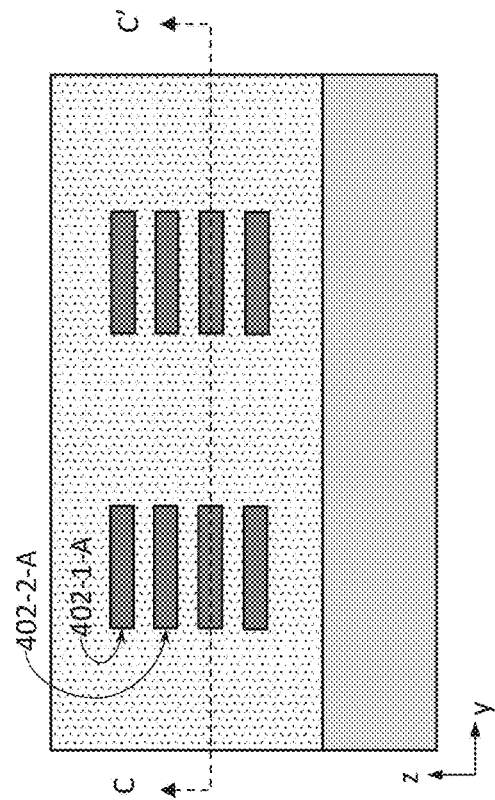
FIG. 4 is a second example cross-section along a plane AA' of the example arrangement shown in FIG. 2, according to some embodiments of the present disclosure.

FIG. 4 is a second example cross-section along a plane AA' of the example arrangement shown in FIG. 2. FIG. 4 shows an alternate configuration of the channel material 204 in which each channel 204 includes a respective set of nanoribbons 402. FIG. 2 may be a cross-section taken along the plane shown in FIG. 4 as plane CC'. In the example of FIG. 4, the first channel 204-A includes four stacked nanoribbons 402, e.g., nanoribbons 402-1-A and 402-2-A, referred to jointly as nanoribbons 402. The nanoribbons 402 may take the form of a nanowire or nanoribbon, for example. In some embodiments, an area of a transversal cross-section of the nanoribbons 402 (i.e., an area in the y-z plane of the example coordinate system x-y-z shown in FIG. 4) may be between about 25 and 10000 square nanometers, including all values and ranges therein (e.g., between about 25 and 1000 square nanometers, or between about 25 and 500 square nanometers). In some embodiments, a width of the nanoribbon 204 (i.e., a dimension measured in a plane parallel to the support structure 202 and in a direction perpendicular to a long axis of the nanoribbon 402, e.g., along the x-axis of the example coordinate system shown in FIG. 2) may be at least about 3 times larger than a height of the nanoribbon 402 (i.e., a dimension measured in a plane perpendicular to the support structure 202, e.g., along the z-axis of the example coordinate system shown in FIG. 4), including all values and ranges therein, e.g., at least about 4 times larger, or at least about 5 times larger. Although the nanoribbons 402 illustrated in FIG. 4 are shown as having a rectangular cross-section, the nanoribbons 402 may instead have a cross-section that is square, a cross-section that is rounded at corners or otherwise irregularly shaped, etc. While each channel 204 is shown as including a stack of four nanoribbons 402, in other embodiments, each channel 204 may include fewer (e.g., one, two, or three) nanoribbons 402, or a greater number of nanoribbons 402. Furthermore, while the nanoribbons 402 in each channel 204 are stacked vertically (e.g., nanoribbon 402-1-A is stacked over nanoribbon 402-2-A), in other embodiments, multiple nanoribbons 402 comprising a channel 204 may have a different arrangement.

While the cross-sections in FIGS. 5-11 depict an example in which each channel 204 includes the set of nanoribbons 402 shown in FIG. 4, it should be understood that in other embodiments, the channel 204 may have the fin shape shown in FIG. 3.

In the examples shown in FIGS. 3 and 4, the dielectric material 206 and support structure 202 are depicted as two different layers. The support structure 202 has an upper face 309, and the dielectric material 206 has a lower face 307 over the upper face 309 of the support structure 202. The dielectric material 206 further has an upper face 305 opposite the lower face 307. In other embodiments, the channels 204 are formed directly in the support structure 202, e.g., in an upper portion of the support structure 202.

In general, the support structure 202 and/or the dielectric material 206 may be a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the support structure 202 may include any such substrate that provides a suitable surface for providing the transistors described herein. In some embodiments, one or more additional layers not shown in FIG. 3 are situated between the support structure 202 and the dielectric material 206.

In some embodiments, the dielectric material 206 may be an insulator material formed over the support structure 202. For example, the dielectric material 206 may be any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the dielectric material 206 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

In some embodiments, the channel material 204 may be composed of semiconductor material systems including, for example, N-type or P-type materials systems. In some embodiments, an IC device may include both N-type and P-type materials, e.g., the channel 204-A is a P-type semiconductor, and the channel 204-B is a P-type semiconductor. In some embodiments, the channel material 204 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 204 may include a combination of semiconductor materials where one semiconductor material may be used for the channel portion, and another material, sometimes referred to as a "blocking material," may be used between the channel portion and the support structure 202 over which the transistor is provided, e.g., as the dielectric material 206 or a portion of the dielectric material 206. In some embodiments, the channel material 204 may include a monocrystalline semiconductor, such as silicon (Si) or germanium (Ge). In some embodiments, the channel material 204 may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material 204 is an epitaxial semiconductor material deposited in the dielectric material 206 using an epitaxial deposition process. The epitaxial semiconductor material may have a polycrystalline structure with a grain size between about 2 nanometers and 100 nanometers, including all values and ranges therein.

For some example N-type transistor embodiments (i.e., for the embodiments where the transistor is an N-type metal-oxide-semiconductor (NMOS)), the channel material 204 may advantageously include a III-V material having a high electron mobility, such as, but not limited to InGaAs, InP, InSb, and InAs. For some such embodiments, the channel material 204 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material 204 may be an intrinsic III-V material, i.e., a III-V semiconductor material not intentionally doped with any electrically active impurity. In alternate embodiments, a nominal impurity dopant level may be present within the channel material 204, for example to further fine-tune a threshold voltage Vt, or to provide HALO pocket implants, etc. Even for impurity-doped embodiments however, impurity dopant level within the channel material 304 may be relatively low, for example below $10^{15}$ dopant atoms per cubic centimeter (cm$^{-3}$), and advantageously below $10^{13}$ cm$^{-3}$.

For some example P-type transistor embodiments (i.e., for the embodiments where the transistor is a P-type metal-oxide-semiconductor (PMOS)), the channel material 204 may advantageously be a group IV material having a high hole mobility, such as, but not limited to Ge or a Ge-rich SiGe alloy. For some example embodiments, the channel material 204 may have a Ge content between 0.6 and 0.9, and advantageously may be at least 0.7. In some embodiments with highest mobility, the channel material 204 may be intrinsic III-V (or IV for P-type devices) material and not intentionally doped with any electrically active impurity. In alternate embodiments, one or more a nominal impurity dopant level may be present within the channel material 204, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$.

In some embodiments, the channel material 204, e.g., the channel material of the nanoribbons 402, may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed around the nanoribbon is a thin-film transistor (TFT), the channel material 204 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 204 may have a thickness between about 5 and 75 nanometers, including all values and ranges therein. In some embodiments, a thin-film channel material may be deposited at relatively low temperatures, which allows depositing the channel material within the thermal budgets imposed on back-end fabrication to avoid damaging other components, e.g., front end components such as the logic devices.

The method 100 may proceed with a process 104 that includes etching the dielectric material 206 around portions of the channel material 204. A result of this process is illustrated in FIGS. 5A and 5B, showing portions 502 etched in the dielectric material 206 and around portions of the channels 204-A and 204-B in the process 104.

FIG. 5A is a top view of the IC structure including the channels 204-A and 204-B with portions 502 of the dielectric material 206 along each of the channels 204-A and 204-B removed. In particular, along each channel 204-A and 204-B, three portions of the dielectric material 206 are removed: along channel 204-A, portions 502-1-A, 502-2-A, and 502-3-A are removed, and along channel 204-B, portions 502-1-B, 502-2-B, and 502-3-B are removed. The outlines of the channels 204-A and 204-B are shown in FIG. 5A for reference, but the full channels 204 are not visible from the top view. Instead, the etching process 104 exposes three portions of each channel 204, while the other portions of the channels 204 remain embedded in and enclosed by the dielectric material 206. Each etched portion 502 of dielectric material 206 is etched down to the support structure 202, exposing the support structure in FIG. 5A; in other embodiments, the etching may not extend to the support structure 202, or may extend partially into the support structure 202.

FIG. 5B shows a cross-section through the etched portions of the dielectric material 206, e.g., along each of the AA', DD', and EE' planes in FIG. 5A. Note that FIG. 5B shows a single cross-section; the cross-section through each of the AA', DD', and EE' planes is substantially identical. FIG. 5B shows two etched portions 502-A and 502-B (e.g., any of the pairs of portions 502-1-A and 502-1-B, 502-2-A and 502-2-B, and 502-3-A and 502-3-B) of dielectric material 206 around two respective exposed portions of the channel material 204. As shown in FIG. 5B, the channel material 204 is exposed on all sides, including the bottom face of the channel material 204 (i.e., the face nearest to the support structure 202). In the nanoribbon example shown in FIG. 5B, the dielectric material 206 between the nanoribbons have also been removed by the process 104.

FIG. 5A further shows a fourth plane, FF', in a region between the etched portions 502-1 and 502-2. FIG. 4, discussed above, shows the cross-section along the plane FF', with the channel material 204 surrounded by the dielectric material 206 along this plane. The cross-section is similar for the region between the etched portions 502-2 and 502-3. FIG. 5A also shows two distances, 510 and 512, where the distance 510 represents the distance between the two etched portions 502-1 and 502-2, and the distance 512 represents the distance between the two etched portions 502-2 and 502-3. Each of the distances 510 and 512 may be between about 1 nanometer and 10 nanometers, including all values and ranges therein, e.g., between about 2 nanometers and 5 nanometers. While the distances 510 and 512 may typically be the same or approximately the same, in some embodiments, the distance 510 may be different from the distance 512.

The dielectric material 206 surrounding the non-exposed portions of the channel 204 (e.g., the portions of dielectric material 206 between the etched portions 502-1 and 502-2 and between the etched portions 502-2 and 502-3) support the exposed portions of the channel 204, which are no longer directly surrounded and supported by the portions of dielectric material 206 that were etched in the process 104. While the channels 204 are depicted as extending further in the x-direction than the first and third portions 502-1 and 502-3, in other examples, the etched portion 502-1 and/or the etched portion 502-3 surround around an end of the channel 204.

Any suitable processes may be used in the process 104 to form the etched portions 502, e.g., any suitable lithographic process in combination with a suitable etching process. In various embodiments, suitable lithographic processes may include photolithography, electron-beam lithography, etc., possibly in combination with using a mask, e.g., a hardmask. The lithographic processes may be used to define locations and dimensions for the etched portions 502. In various embodiments, a suitable etching process is used to remove the portions 502 of the dielectric material 206, e.g., using dry etch, wet etch, reactive ion etch (RIE), ion milling, etc. For example, any suitable anisotropic etch process, e.g., a dry etch, may be used in the process 104 to etch the dielectric material 206 through the openings defined by the lithographic process (e.g., openings defined in a photoresist material, not shown in FIG. 5) to form the portions 502. In some embodiments, during the etch of the dielectric material 206 in the process 104, the IC structure may be heated to elevated temperatures, e.g., to temperatures between about room temperature and 200 degrees Celsius, including all values and ranges therein, to promote that byproducts of the etch are made sufficiently volatile to be removed from the surface.

Figure 6B:
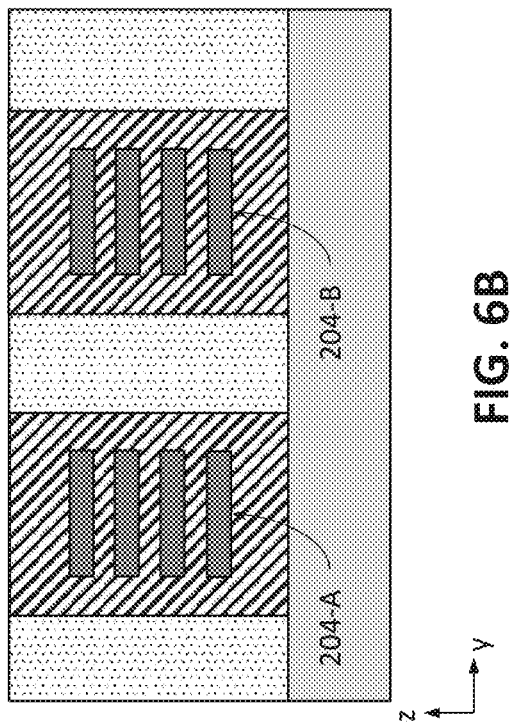
FIGS. 6A and 6B show a top view and cross-sections of source and drain regions enclosing portions of the channel, according to some embodiments of the present disclosure.
Figure 6A:
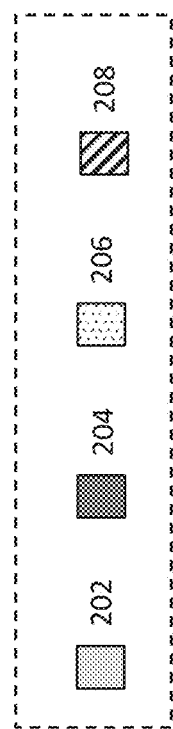

The method 100 may proceed with a process 106 that includes depositing source and drain materials around two exposed portions of each channel 204. A result of this process is illustrated in FIGS. 6A and 6B, showing source and drain regions enclosing two portions of each of the channels. As described above, the source and drain regions of a transistor are interchangeable, and a nomenclature of a first S/D region and a second S/D region of a transistor has been introduced for use in the present disclosure. In FIGS. 6A and 6B, reference numeral 208-1 is used to label the first S/D region (e.g., reference numeral 208-1-A refers to the first S/D region of the first transistor, and reference numeral 208-1-B refers to the first S/D region of the second transistor), and reference numeral 208-2 is used to label the second S/D region (e.g., reference numeral 208-2-A refers to the second S/D region of the first transistor, and reference numeral 208-2-B refers to the second S/D region of the second transistor).

As shown in FIG. 6A, the first etched portion 502-1 along each channel 204 and the third etched portion 504-3 along each channel 204 are filled in with a S/D material. FIG. 6B shows a cross-section through the first S/D regions 208-1, e.g., along the DD' plane in FIG. 6A, and through the second S/D regions 208-2, e.g., along the EE' plane in FIG. 6A; the cross-section through each of the DD' and EE' planes is substantially identical. As shown in FIG. 6B, the S/D region 208 encloses the channel material 204 on all sides, including below the bottom face of the channel material 204 (i.e., the face nearest to the support structure 202). In the nanoribbon example shown in FIG. 6B, the S/D region 208 extends into the areas between the nanoribbons, enclosing each individual nanoribbon. Each S/D region 208 has a first face that is co-planar with the upper face 305 of the dielectric material 206, and a second face that is co-planar with the lower face 307 of the dielectric material 206.

The S/D regions 208 may generally be formed using a deposition process. In particular, an epitaxial deposition process may be carried out to fill the etched portions 502-1 and 502-3 with material that is used to fabricate the S/D regions 208. A conformal deposition process, such as atomic layer deposition (ALD) or chemical vapor deposition (CVD), may be used to deposit the S/D regions 208. Conformal deposition generally refers to deposition of a certain coating on any exposed surface of a given structure. A conformal coating may, therefore, be understood as a coating that is applied to exposed surfaces of a given structure, and not, for example, just to the horizontal surfaces. In some implementations, the S/D regions 208 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 208 may be formed using one or more alternate semiconductor materials such as germanium or a group III-V material or alloy. And in further embodiments, one or more layers of metal and/or metal alloys may be used to form the S/D regions 208.

Figure 7B:
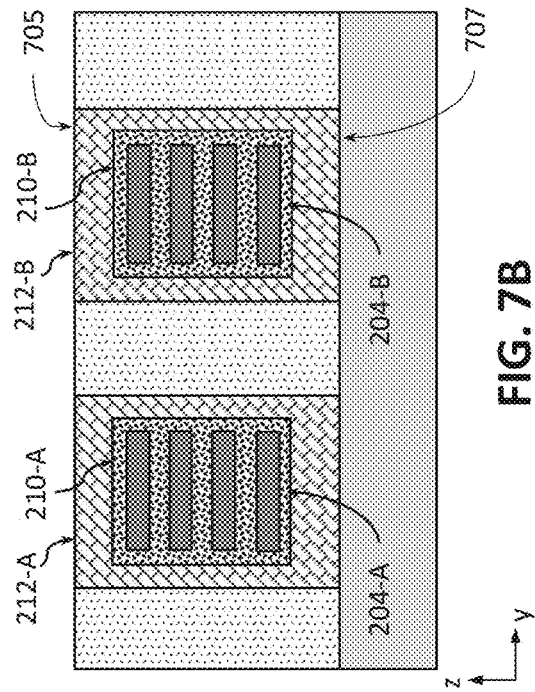
FIGS. 7A-7C show a top view and two example cross-sections of a gate enclosing a portion of the channel, according to some embodiments of the present disclosure.

The method 100 may proceed with a process 108 that includes depositing a gate electrode around the other etched portion of each channel 204. A result of this process is illustrated in FIGS. 7A and 7B, showing a gate stack enclosing a portion of each of the channels 204-A and 204-B. Each gate stack includes a gate dielectric 210 enclosing a portion of the channel material 204, and a gate electrode 212 enclosing the gate dielectric 210. Depositing the S/D regions 208 and gate electrodes 212 provides a transistor 700 formed along a channel 204. FIG. 7A includes two transistors: a first transistor 700-A, formed around the first channel 204-A, and a second transistor 700-B, formed around the second channel 204-B. In FIG. 7B, reference numeral 210-A refers to the gate dielectric of the first transistor 700-A, reference numeral 210-B refers to the gate dielectric of the second transistor 700-B, reference numeral 212-A refers to the gate electrode of the first transistor 700-A, and reference numeral 212-B refers to the gate electrode of the second transistor 700-B.

As shown in FIG. 7A, the second etched portion 502-2 along each channel 204 is filled in with the gate electrode material. FIG. 7B shows an example cross-section through the gate, e.g., along the AA' plane in FIG. 7A. As shown in FIG. 7B, the gate electrode 212 encloses the channel material 204 on all sides, including below the bottom face of the channel material 204 (i.e., the face nearest to the support structure 202). In the nanoribbon example shown in FIG. 7B, the gate dielectric 210 extends into the areas between the nanoribbons, enclosing the set of nanoribbons, and the gate electrode 212 encloses the gate dielectric 210. Each gate electrode 212 has a first face that is co-planar with the upper face 305 of the dielectric material 206, and a second face that is co-planar with the lower face 307 of the dielectric material 206. These faces may also be referred to as the first face 705 and second face 707 of the transistors; the first face 705 and second face 707 of the transistors are co-planar with the upper face 305 and lower face 307 of the dielectric material 206, respectively.

Figure 7C:
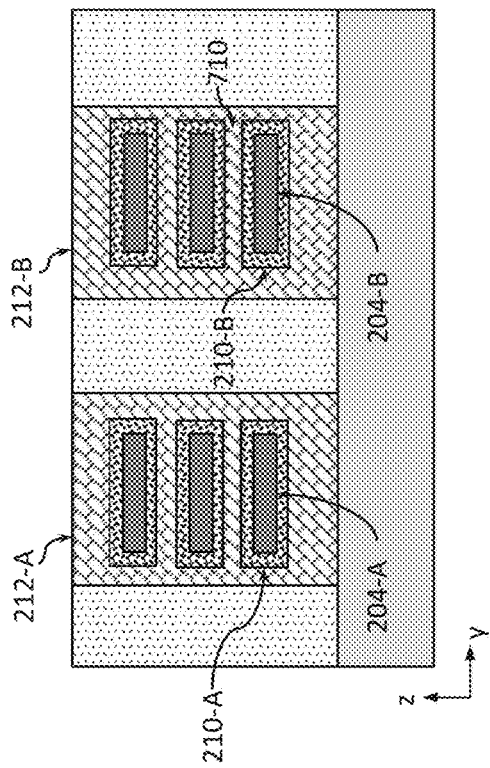
Figure 7A:
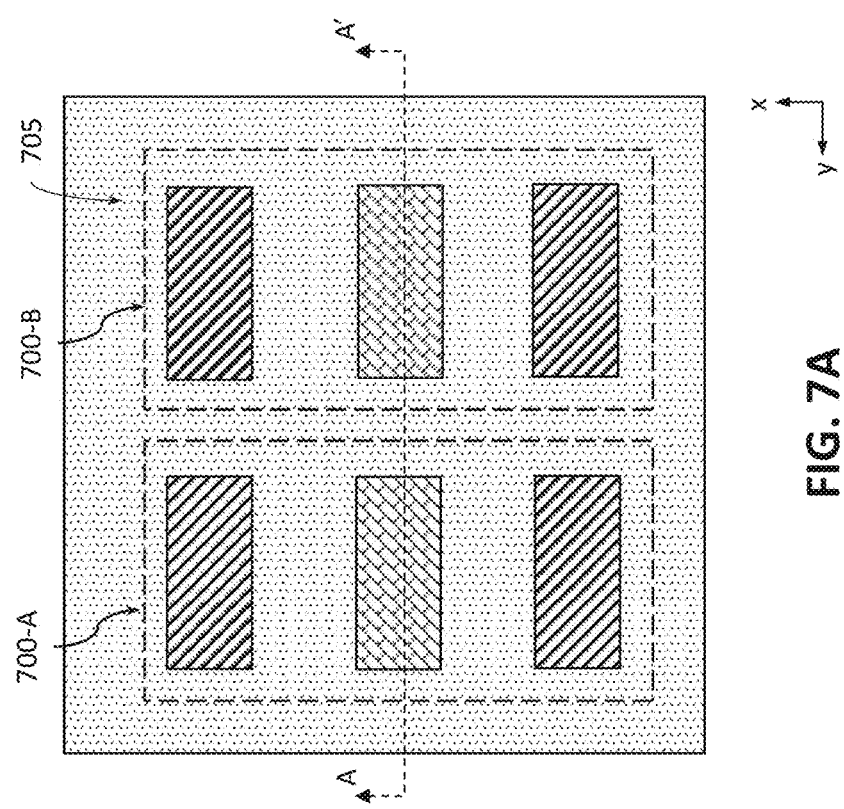

FIG. 7C shows an alternate cross-section AA' through the gate. In FIG. 7C, the gate dielectric 210 encloses each individual nanoribbon, but does not encompass the full area between the nanoribbons. For example, the gate dielectric 210 does not extend into a region 710 between two of the nanoribbons forming the second channel 204-B. In FIG. 7C, the gate electrode 212 encloses each nanoribbon, which has been previously enclosed by the gate dielectric 210. The gate electrode 212 extends into the areas between the gate dielectric 210, e.g., the gate electrode 212 extends into the region 710 between two of the nanoribbons. Whether the gate dielectric 210 fully encloses the set of nanoribbons, as shown in FIG. 7B, or encloses the individual nanoribbons while leaving a gap between the nanoribbons, as shown in FIG. 7C, depends on the thickness of the gate dielectric 210 and the distance between the nanoribbons.

Each gate may generally be formed using a deposition process that includes depositing the gate dielectric 210 and then depositing the gate electrode 212. For example, a conformal deposition process, such as ALD or CVD, may be used to deposit the gate dielectric 210 and/or gate electrode 212.

In some embodiments, the gate dielectric 210 may include one or more high-k dielectrics. Examples of high-k materials that may be used in the gate dielectric 210 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 210 during manufacture of the transistor to improve the quality of the gate dielectric 210.

The gate electrode 212 may include at least one P-type work function metal or N-type work function metal, depending on whether the transistor is a PMOS transistor or an NMOS transistor (P-type work function metal used as the gate electrode 212 when the transistor is a PMOS transistor and N-type work function metal used as the gate electrode 212 when the transistor is an NMOS transistor). As noted above, a single device may include one or more NMOS transistors and one or more PMOS transistors, e.g., the first transistor 700-A is an NMOS transistor, and the second transistor 700-B is a PMOS transistor. For a PMOS transistor, metals that may be used for the gate electrode 212 may include, but are not limited to, ruthenium, palladium, platinum, cobalt, nickel, and conductive metal oxides (e.g., ruthenium oxide). For an NMOS transistor, metals that may be used for the gate electrode 212 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 212 may consist of a stack of two or more metal layers, where one or more metal layers are work function metal layers and at least one metal layer is a fill metal layer. Further layers may be included next to the gate electrode 212 for other purposes, such as to act as a diffusion barrier layer or/and an adhesion layer.

Figure 6A:
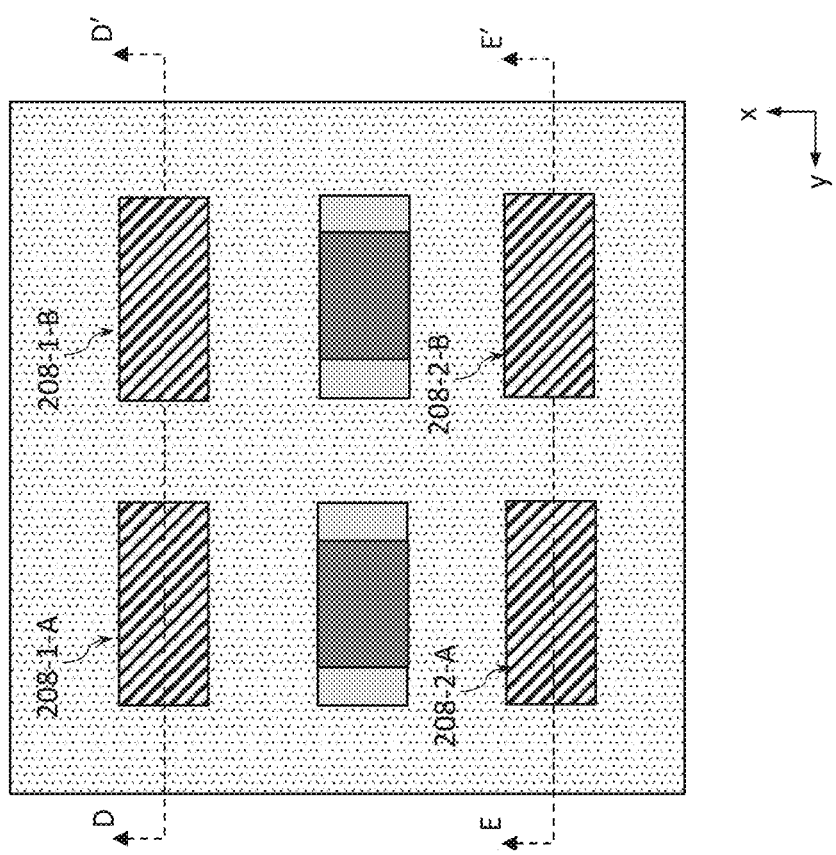

While the method 100 and FIGS. 6 and 7 show the S/D regions 208 being deposited before the gate dielectric 210 and gate electrode 212, these processes may be completed in any order, e.g., the gate dielectric 210 and gate electrode 212 may be deposited before the S/D regions 208, or the S/D region 208 may be deposited after the gate dielectric 210 and before the gate electrode 212.

The method 100 may proceed with a process 110 that includes depositing front-side contacts coupled to the S/D regions and gate of a transistor 700. A result of this process is illustrated in FIGS. 8A-8C, showing a top view and cross-section views of source, gate, and drain contacts on a front-side of the pair of transistors 700-A and 700-B.

Figure 8B:
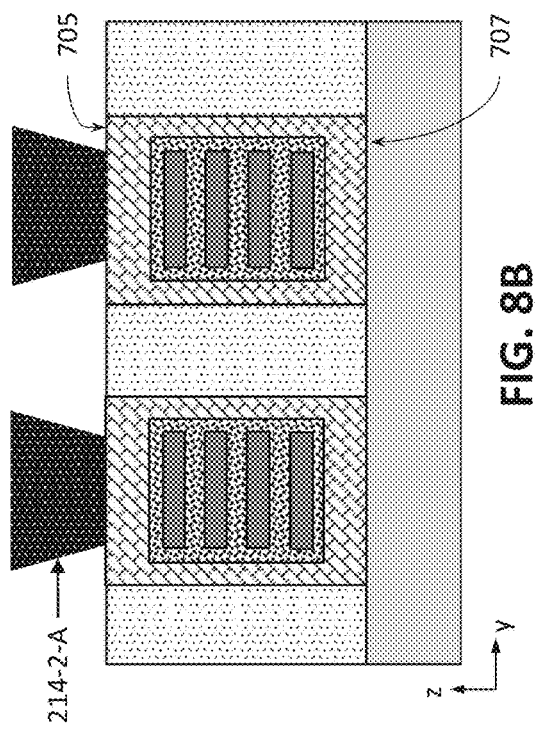
FIGS. 8A-8C show a top view and cross-section views of source, gate, and drain contacts on a front-side of the transistor, according to some embodiments of the present disclosure.
Figure 8C:
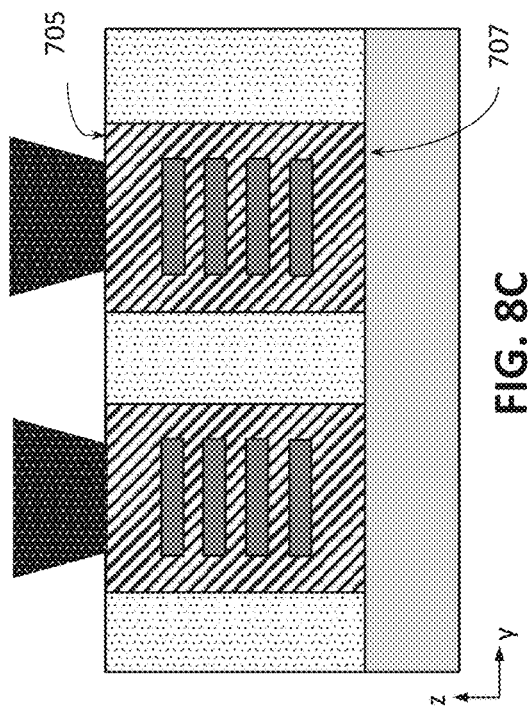
Figure 8A:
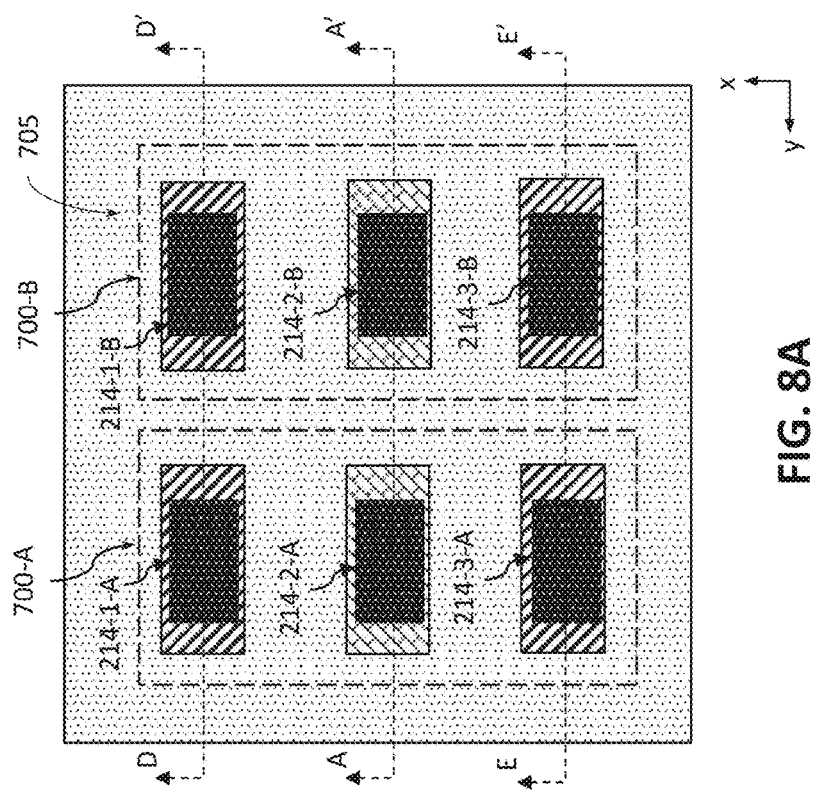

In FIGS. 8A-8C, reference numeral 214-1 is used to label the first front-side S/D contact (e.g., reference numeral 214-1-A refers to the first front-side S/D contact of the first transistor, and reference numeral 214-1-B refers to the first front-side S/D contact of the second transistor), reference numeral 214-2 is used to label the front-side gate contact (e.g., reference numeral 214-2-A refers to the front-side gate contact of the first transistor, and reference numeral 214-2-B refers to the front-side gate contact of the second transistor), and reference numeral 214-3 is used to label the second front-side S/D contact (e.g., reference numeral 214-3-A refers to the second front-side S/D contact of the first transistor, and reference numeral 214-3-B refers to the second front-side S/D contact of the second transistor). The first front-side S/D contact 214-1, front-side gate contact 214-2, and second front-side S/D contact 214-3 are jointly referred to as front-side contacts 214.

As shown in FIG. 8A, the front-side contacts 214 are formed over the S/D regions 208 and gate electrodes 212 on the first face 705 of the transistors. FIG. 8B shows a cross-section through the gate electrodes 212, e.g., along the AA' plane in FIG. 8A. FIG. 8C shows a cross-section through the first S/D regions 208-1, e.g., along the DD' plane in FIG. 8A, and through the second S/D regions 208-2, e.g., along the EE' plane in FIG. 8A; the cross-section through each of the DD' and EE' planes is substantially identical. The front-side contacts 214 extend in a direction perpendicular to the first face 705 of the transistors, e.g., in the direction of the z-axis shown in FIGS. 8B and 8C. As shown in FIGS. 8B and 8C, the front-side contacts 214 may decrease in width moving downward along the z-axis and approaching the first face 705 of the transistors 700. The front-side contacts 214 are substantially trapezoidal, as seen in FIGS. 8B and 8C, with the width of the tops of the front-side contacts 214 (i.e., farther away from the S/D regions 208) being larger than the width of the bottoms of the front-side contacts 214 (i.e., closer to the S/D regions 208), where both of these widths are measured along the y-axis of the example coordinate system shown.

The front-side contacts 214 are formed of one or more electrically conductive materials for providing electrical connectivity to the S/D regions 208 and gate electrodes 212. In various embodiments, one or more layers of metal and/or metal alloys may be used to form the front-side contacts 214. For example, the electrically conductive materials of the front-side contacts 214 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the front-side contacts 214 may include one or more electrically conductive alloys, oxides, or carbides of one or more metals. In some embodiments, the front-side contacts 214 may include a doped semiconductor, such as silicon or another semiconductor doped with an N-type dopant or a P-type dopant. Metals may provide higher conductivity, while doped semiconductors may be easier to pattern during fabrication. Although FIGS. 8A-8C illustrate the front-side S/D contacts 214-1 and 214-3 and front-side gate contacts 214-2 with a single pattern, suggesting that the material composition of the front-side contacts 214-1, 214-2, and 214-3 are the same, this may not be the case in some other embodiments. For example, in some embodiments, the material composition of the front-side S/D contacts 214-1 and 214-3 may be different from the material composition of the front-side gate contacts 214-2.

Figure 13:
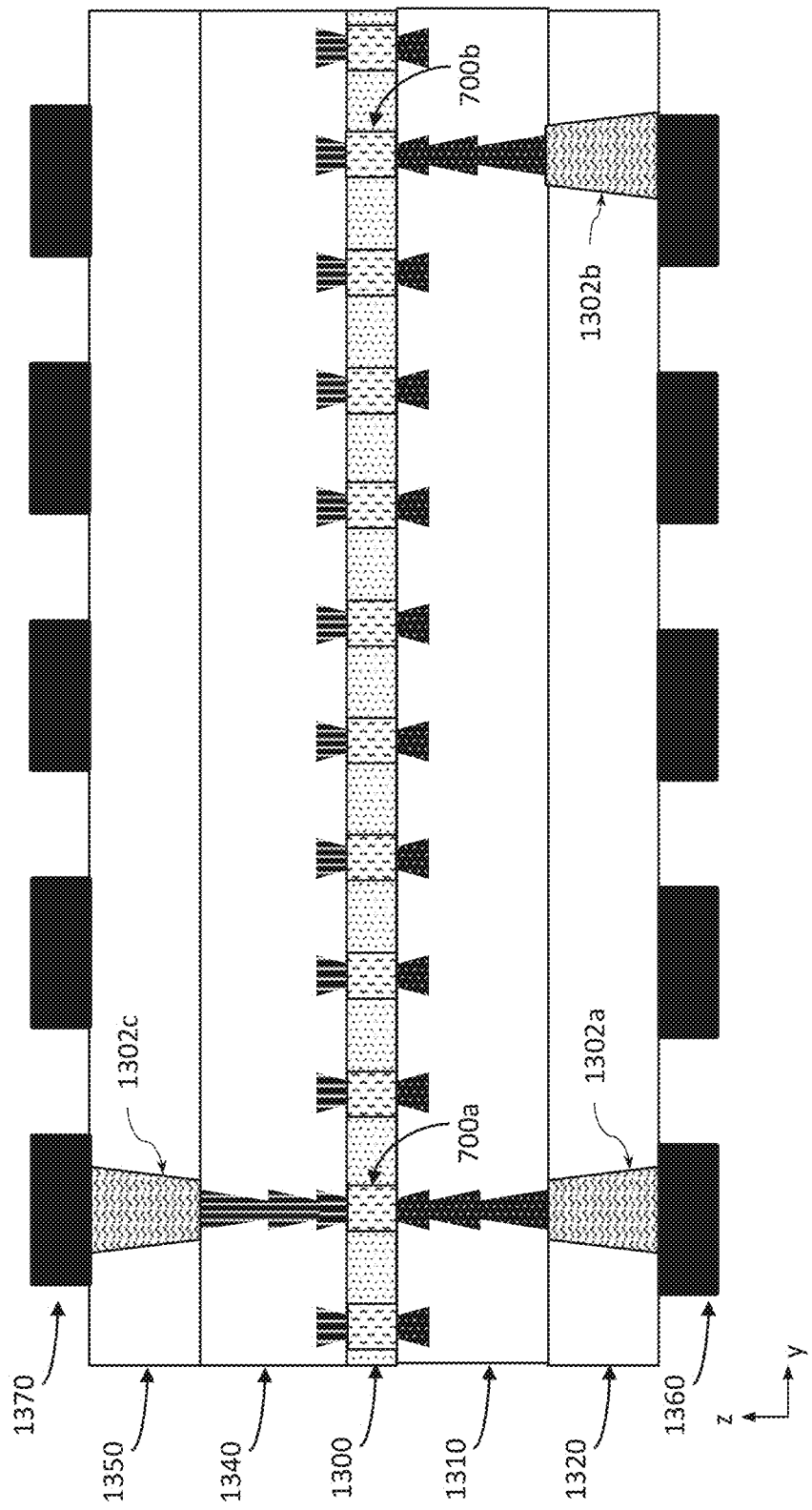
FIG. 13 is a cross-section of an example IC device having transistors with front-side and back-side contacts and routing, according to some embodiments of the present disclosure.
Figure 14:
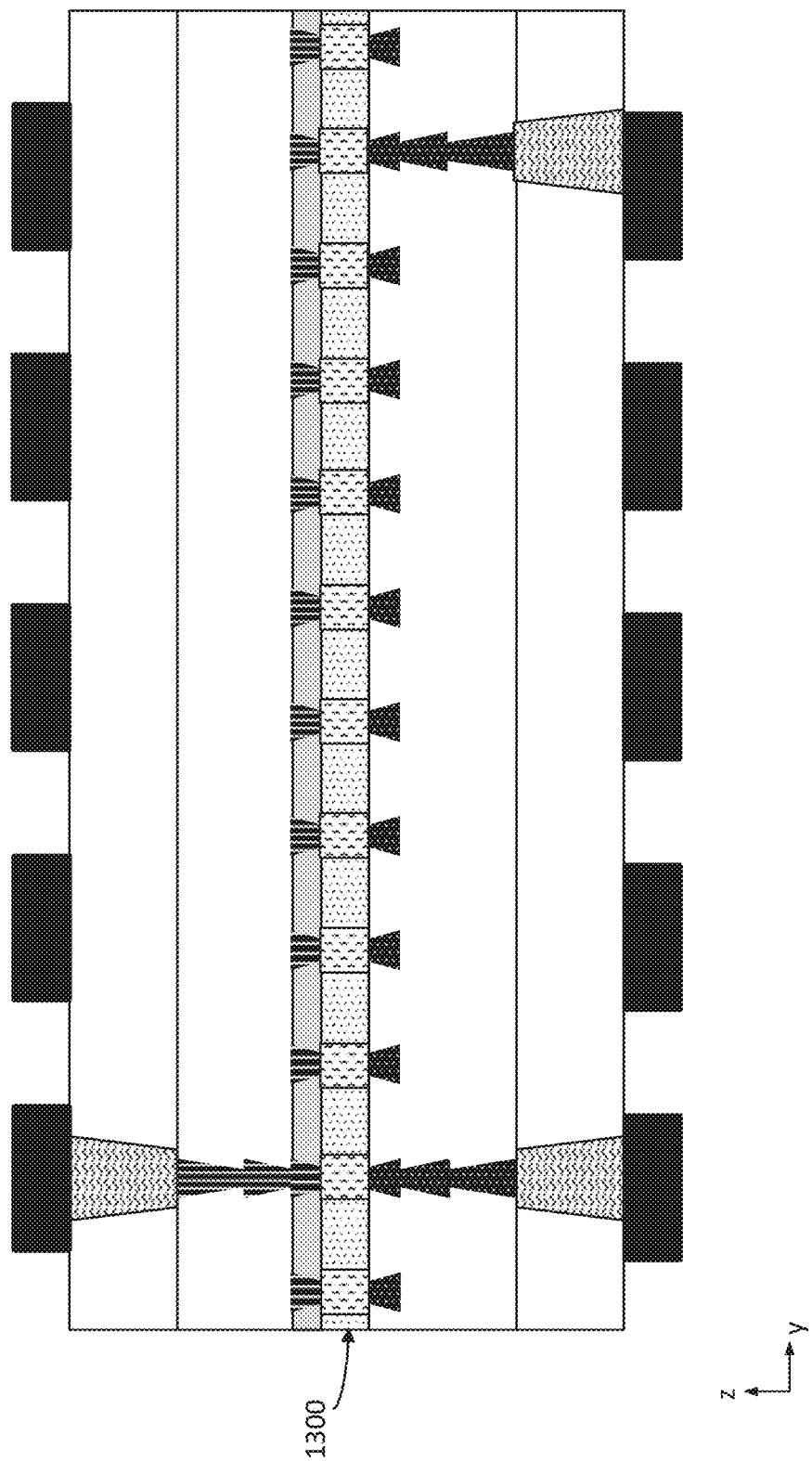
FIG. 14 is a cross-section of a second example IC device having transistors with front-side and back-side contacts and routing, according to some embodiments of the present disclosure.

In some embodiments, the method 100 may proceed with a process 112 that includes processing additional front-side layers. One or more additional layers may be processed over the front-side of the IC device having the transistors 700. For example, one or more interconnect layers, memory layers, device layers, etc. may be fabricated on the front-side of the IC device. Two examples of IC devices with a layer of transistors 700 and additional front-side layers are shown in FIGS. 13 and 14.

The method 100 may proceed with a process 114 that includes flipping the IC device and grinding the support structure 202. This process is illustrated in FIG. 9A, which shows a cross-section view of the IC device being flipped, and FIG. 9B, which shows the result of grinding the support structure 202.

After the front-side contacts 214 are formed on the front-side of the transistors, the front-side of the IC device is flipped and attached to a carrier structure 902, e.g., a second support structure, as illustrated in FIG. 9A. The relative positions of the first face 705 and second face 707 are flipped, with the second face 707 above the first face 705 in the second illustration of FIG. 9A. The carrier structure 902 may be similar to any of the support structures 202 described above. In some embodiments, the carrier structure 902 may be formed from one or more semiconductor materials, while in other embodiments, the carrier structure 902 may be formed from one or more insulator materials, e.g., any of the dielectric materials described with respect to the dielectric material 206. While the carrier structure 902 and support structure 202 are illustrated with the same pattern, the carrier structure 902 may have a different material composition from the support structure 202. The IC device may be flipped over and pressed onto the carrier structure 902, with suitable pressure and/or heat to adhere the carrier structure 902 to the IC device (e.g., to the front-side contacts 214 as shown in FIG. 9A, or the front-side of another layer processed over the transistors 700 and front-side contacts 214). A bonding material may be used to attach the IC device to the carrier structure 902. In some embodiments, if the additional layers fabricated in process 112 provide sufficient mechanical support for the IC device, a carrier structure 902 may not be used.

After the IC device is flipped, the support structure 202 on the back-side may be grinded to reveal the back-sides of the transistors 700, i.e., the second face 707. In the example shown in FIG. 9B, the support structure 202 is completely removed, i.e., to a thickness of 0 nanometers. In other embodiments, a portion of the support structure 202 remains, e.g., the support structure 202 is grinded to a thickness less than about 5 microns, including any range therein, e.g., between 1 nanometers and 50 nanometers. An example in which a portion of the support structure 202 remains after grinding is shown in FIG. 11. Grinding the support structure 202 to reveal the transistors 700 may be performed using any suitable thinning/polishing processes as known in the art.

The method 100 may proceed with a process 116 that includes depositing back-side contacts coupled to the S/D regions and gate of a transistor 700. A result of this process is illustrated in FIGS. 10A-10C, showing a top view and cross-section views of source, gate, and drain contacts on a back-side of the pair of transistors 700-A and 700-B. Note that FIG. 10A shows the top-side view of the flipped IC device. The relative locations of transistor 700-A and 700-B are flipped relative to their locations in FIGS. 8A-8C (e.g., transistor 700-A is on the right side in FIG. 10A, and transistor 700-B is on the left side in FIG. 10B) after the IC device was flipped, as shown in FIG. 9A.

In FIGS. 10A-10C, reference numeral 216-1 is used to label the first back-side S/D contact (e.g., reference numeral 216-1-A refers to the first back-side S/D contact of the first transistor, and reference numeral 216-1-B refers to the first back-side S/D contact of the second transistor), reference numeral 216-2 is used to label the back-side gate contact (e.g., reference numeral 216-2-A refers to the back-side gate contact of the first transistor, and reference numeral 216-2-B refers to the back-side gate contact of the second transistor), and reference numeral 216-3 is used to label the second back-side S/D contact (e.g., reference numeral 216-3-A refers to the second back-side S/D contact of the first transistor, and reference numeral 216-3-B refers to the second back-side S/D contact of the second transistor). The first back-side S/D contact 216-1, back-side gate contact 216-2, and second back-side S/D contact 216-3 are jointly referred to as back-side contacts 216.

As shown in FIG. 10A, the back-side contacts 216 are formed over the S/D regions 208 and gate electrodes 212 on the second face 707 of the transistors. FIG. 10B shows a cross-section through the gate electrodes 212, e.g., along the AA' plane in FIG. 10A. FIG. 10C shows a cross-section through the first S/D regions 208-1, e.g., along the DD' plane in FIG. 10A, and through the second S/D regions 208-2, e.g., along the EE' plane in FIG. 10A; the cross-section through each of the DD' and EE' planes is substantially identical. The front-side contacts 216 extend in a direction perpendicular to the second face 707 of the transistors, e.g., in the direction of the z-axis shown in FIGS. 10B and 10C. As shown in FIGS. 10B and 10C, the back-side contacts 216 may decrease in width moving downward along the z-axis and approaching the second face 707 of the transistors 700. The back-side contacts 216 are substantially trapezoidal, as seen in FIGS. 10B and 10C, with the width of the tops of the back-side contacts 216 (i.e., farther away from the S/D regions 208) being larger than the width of the bottoms of the back-side contacts 216 (i.e., closer to the S/D regions 208), where both of these widths are measured along the y-axis of the example coordinate system shown. The front-side contacts 214 and back-side contacts 216 both decrease in width moving towards the transistors 700-A and 700-B. For example, in the flipped orientation shown in FIG. 10B, the front-side contact 214-2-B decreases in width moving upwards along the z-axis and towards the first face 705, and the back-side contact 216-2-B increases in width moving upwards along the z-axis and away from the second face 707.

The back-side contacts 216 are formed of one or more electrically conductive materials for providing electrical connectivity to the S/D regions 208 and gate electrodes 212, such as any of the materials described with respect to the front-side contacts 214. Although FIGS. 10A-10C illustrate the back-side S/D contacts 216-1 and 216-3 and back-side gate contacts 216-2 with a single pattern, suggesting that the material composition of the back-side contacts 216-1, 216-2, and 216-3 are the same, this may not be the case in some other embodiments. Furthermore, although FIGS. 10A-10C illustrate the back-side contacts 216 and front-side contacts 214 with different patterns, suggesting that the material composition of the back-side contacts 216 and front-side contacts 214 are different, in some embodiments, the back-side contacts 216 and front-side contacts 214 may comprise the same material.

While each transistor 700-A and 700-B is illustrated as having three front-side contacts and three back-side contacts, in other embodiments, a given transistor 700 may have a subset of these contacts, e.g., a transistor 700 may have only back-side contacts or only front-side contacts, or a transistor may not have a full set of front-side and/or back-side contacts. For example, a transistor 700 may have front-side and back-side S/D contacts, but only a front-side gate contact. Any combination of contacts on the front-side and back-side may be used. In an IC device with many transistors 700, different transistors may have different sets of contacts, e.g., some transistors have both front-side contacts and back-side contacts, and other transistors have only front-side contacts.

The arrangement shown in FIGS. 10A-10C (and other figures of the present disclosure) is intended to show relative arrangements of some of the components therein, and in particular, the arrangements of the transistors 700 and the front-side and back-side contacts. An IC device including one or more of the transistors 700 may include other components that are not illustrated. For example, a dielectric spacer may be provided between one or both of the S/D contacts and the gate contacts in order to provide additional electrical isolation between the source, gate, drain contacts.

In some embodiments, the method 100 may proceed with a process 118 that includes processing additional back-side layers. One or more additional layers may be processed over the back-side of the IC device having the transistors 700. For example, one or more interconnect layers, memory layers, device layers, etc. may be fabricated on the back-side of the IC device. Two examples of IC devices with a layer of transistors 700 and additional front-side and back-side layers are shown in FIGS. 13 and 14.

FIG. 11 illustrates a cross-section view of gate contacts formed in a support structure on the back-side of the transistor, according to some embodiments of the present disclosure. As noted above in relation to FIG. 9B, in some embodiments, a portion of the support structure 202 remains after the grinding process. In this example, the back-side contacts 216 are deposited through the remaining support structure 202. For example, portions of the support structure 202 are etched away, and the back-side contacts 216 are deposited in the etched portions.

FIG. 12 illustrates an example back-side contact layout for two neighboring transistors, according to some embodiments of the present disclosure. While FIGS. 10A-10C show each S/D region 208 and each gate electrode 212 of the transistors 700-A and 700-B having an individuated back-side contact 216, in some embodiments, a back-side contact 216 may span across two or more transistors. In the example shown in FIG. 12, the first S/D contact spans the first S/D regions of the neighboring transistors 700-A and 700-B, and the gate contact spans the gate electrodes of the neighboring transistors 700-A and 700-B, while each of the transistors 700-A and 700-B has a respective individuated second S/D contact. One or more front-side contacts 214 may span across two or more neighboring transistors in a similar manner.

Example IC Devices Having Transistors with Front-Side and Back-Side Contacts

As described above with respect to processes 112 and 118, in some embodiments, one or more additional front-side layers and/or back-side layers are processed over the front-sides and/or back-sides of the transistors 700. FIG. 13 is a cross-section of an example IC device having transistors with front-side and back-side contacts and routing, according to some embodiments of the present disclosure. In this example, a transistor layer 1300 includes an array of the transistors 700 formed in the dielectric material 206. The transistors 700 are formed as described with respect to FIGS. 2-7. A single pattern is shown to represent the cross-section of the transistors 700, but it should be understood that the transistors 700 may have the cross-sections shown in FIG. 3 or 4, 6, and 7 at various points along their length. Front-side contacts 214 and back-side contacts 216 are formed on either side of the transistor layer 1300, as described with respect to FIGS. 8-10.

On either side of the transistor layer 1300 and the contacts 214 and 216 are additional layers processed over the front-side and back-side layers. For example, one or more interconnect layers 1310 and a memory layer 1320 are processed over the front-side contacts 214. These layers 1310 and 1320 may be formed after the front-side contacts 214 are formed in process 110 and before the support structure is flipped and grinded to reveal the back-side of the transistor layer 1300 in process 114. The interconnect layer 1310 provides routing of electrical signals to additional devices on or connected to the front-side of the transistor layer 1300. For example, a first portion of the interconnect layer 1310 couples one of the transistors 700a to a first capacitor 1302a formed in the memory layer 1320, and a second portion of the interconnect layer 1310 couples a second one of the transistors 700b to a second capacitor 1302b formed in the memory layer 1320.

In general, a memory cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one S/D region of the access transistor (e.g., to the first S/D region 208-1 of the transistor 700), while the other S/D region (e.g., the second S/D region 208-2 of the transistor 700) of the access transistor may be coupled to a bit-line (BL), and a gate terminal of the access transistor may be coupled to a word-line (WL). The other electrode of the capacitor is coupled to a plate-line (PL). The WL, BL, and PL are used together to read and program the capacitor.

In the example shown in FIG. 13, the transistor 700a is an access transistor for the capacitor 1302a, and the transistor 700b is an access transistor for the capacitor 1302b. Additional layers, such as one or more interconnect layers 1340 and a memory layer 1350, are processed over the back-side contacts 216. The interconnect layer 1340 provides routing of electrical signals to additional devices on or connected to the back-side of the transistor layer 1300. For example, the illustrated portion of the interconnect layer 1340 couples the transistor 700a to a third capacitor 1302c formed in the memory layer 1350. In this example, the transistor 700a serves as an access transistor to a capacitor 1302a in the front-side memory layer 1320 and a capacitor 1302c in the back-side memory layer 1350.

In this example, the IC device includes front-side bond pads 1360 formed on the memory layer 1320 and back-side bond pads 1370 formed on the back-side memory layer 1350. The bond pads 1360 and 1370 may be electrically coupled with the memory layers 1320 and 1350 and configured to route electrical signals to other external devices. In some embodiments, the bond pads 1360 and 1370 may be coupled to one or more additional layers formed over the memory layers 1320 and 1350, e.g., to an additional interconnect layer not shown in FIG. 13. Solder bonds may be formed on the bond pads 1360 and 1370 to mechanically and/or electrically couple the IC device with another component (e.g., a circuit board).

FIG. 14 is a cross-section of a second example IC device having transistors with front-side and back-side contacts and routing, according to some embodiments of the present disclosure. FIG. 14 shows a similar arrangement to FIG. 13, with a transistor layer 1300 coupled to front-side and back-side interconnect layers and devices. In the example shown in FIG. 14, a portion of the support structure 202 remains, and the back-side contacts 216 are formed through the support structure 202, as described with respect to FIG. 11.

Example Devices

The transistors with front-side and back-side contacts disclosed herein may be included in any suitable electronic device. FIGS. 15-18 illustrate various examples of apparatuses that may include one or more of the transistors with front-side and back-side contacts disclosed herein.

Figure 15B:
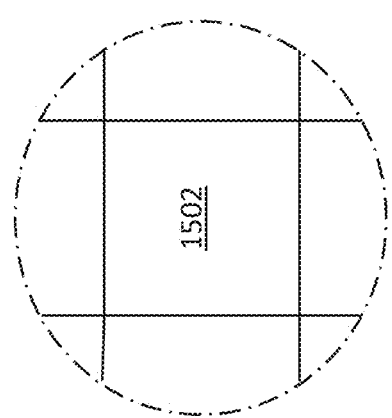
FIGS. 15A and 15B are top views of a wafer and dies that include one or more transistors with front-side and back-side contacts in accordance with any of the embodiments disclosed herein.
Figure 15A:
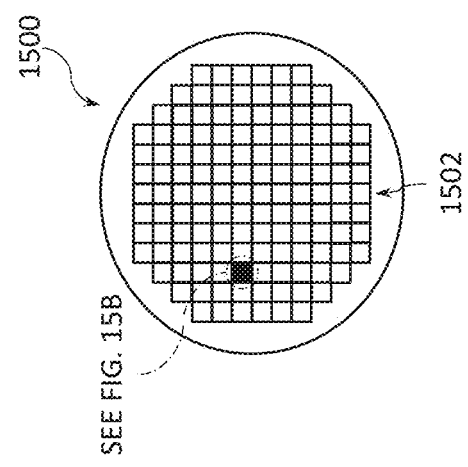

FIGS. 15A and 15B are top views of a wafer and dies that include one or more IC structures with one or more transistors with front-side and back-side contacts in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 2-14, or any further embodiments of the IC structures described herein). After the fabrication of the semiconductor product is complete (e.g., after manufacture of one or more IC structures with one or more transistors with front-side and back-side contacts as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more IC structures with one or more transistors with front-side and back-side contacts as disclosed herein may take the form of the wafer 1500 (e.g., not singulated) or the form of the die 1502 (e.g., singulated). The die 1502 may include one or more transistors (e.g., one or more of the transistors 1640 of FIG. 16, discussed below) and/or supporting circuitry to route electrical signals to the transistors, as well as any other IC components (e.g., one or more IC structures with one or more transistors with front-side and back-side contacts). In some embodiments, the wafer 1500 or the die 1502 may include a memory device (e.g., a static random-access-memory (SRAM) device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 18) or other logic that is configured to store information in the memory devices or execute instructions stored in the memory array.

Figure 16:
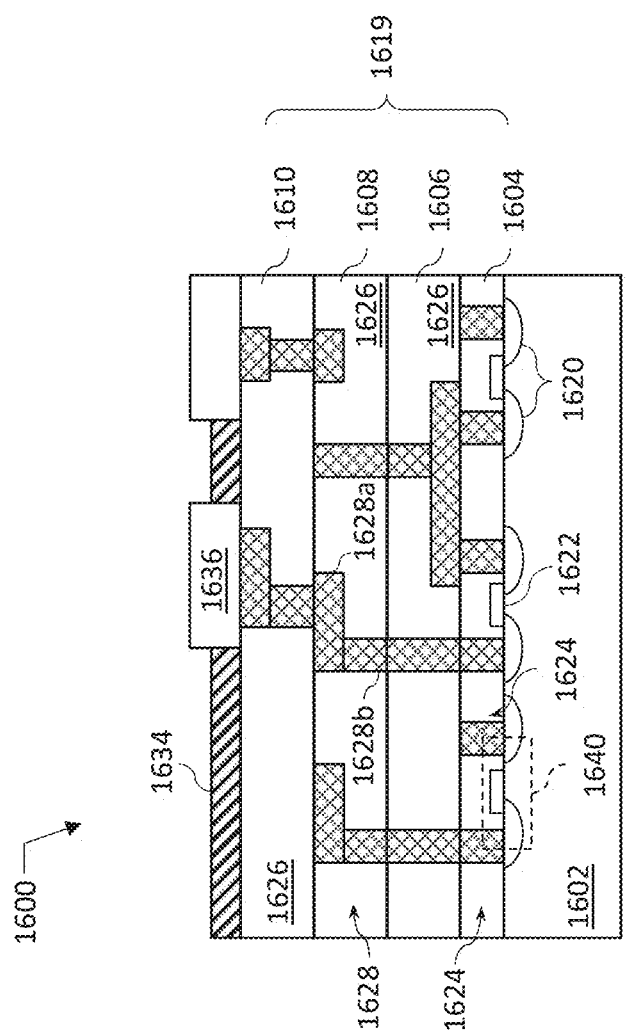
FIG. 16 is a cross-sectional side view of an IC device that may include one or more transistors with front-side and back-side contacts in accordance with any of the embodiments disclosed herein.

FIG. 16 is a cross-sectional side view of an IC device 1600 that may include one or more IC structures with one or more transistors with front-side and back-side contacts in accordance with any of the embodiments disclosed herein.

The IC device 1600 may be formed on a substrate 1602 (e.g., the wafer 1500 of FIG. 15A) and may be included in a die (e.g., the die 1502 of FIG. 15B). The substrate 1602 may be any substrate as described herein. The substrate 1602 may be part of a singulated die (e.g., the dies 1502 of FIG. 15B) or a wafer (e.g., the wafer 1500 of FIG. 15A).

The IC device 1600 may include one or more device layers 1604 disposed on the substrate 1602. The device layer 1604 may include features of one or more transistors 1640 (e.g., metal-oxide-semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 16 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 16, the IC device 1600 may include one or more transistors with front-side and back-side contacts at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 16 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 16). Although a particular number of interconnect layers 1606-1610 is depicted in FIG. 16, embodiments of the present disclosure include IC devices having more or fewer interconnect layers than depicted.

In some embodiments, the interconnect structures 1628 may include trench contact structures 1628*a* (sometimes referred to as "lines") and/or via structures 1628*b* (sometimes referred to as "holes") filled with an electrically conductive material such as a metal. The trench contact structures 1628*a* may be arranged to route electrical signals in a direction of a plane that is substantially parallel with a surface of the substrate 1602 upon which the device layer 1604 is formed. For example, the trench contact structures 1628*a* may route electrical signals in a direction in and out of the page from the perspective of FIG. 16. The via structures 1628*b* may be arranged to route electrical signals in a direction of a plane that is substantially perpendicular to the surface of the substrate 1602 upon which the device layer 1604 is formed. In some embodiments, the via structures 1628*b* may electrically couple trench contact structures 1628*a* of different interconnect layers 1606-1610 together.

The interconnect layers 1606-1610 may include a dielectric material 1626 disposed between the interconnect structures 1628, as shown in FIG. 16. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628*a* and/or via structures 1628*b*, as shown. The trench contact structures 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628*b* to couple the trench contact structures 1628*a* of the second interconnect layer 1608 with the trench contact structures 1628*a* of the first interconnect layer 1606. Although the trench contact structures 1628*a* and the via structures 1628*b* are structurally delineated with a line within each interconnect layer (e.g., within the second interconnect layer 1608) for the sake of clarity, the trench contact structures 1628*a* and the via structures 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 17:
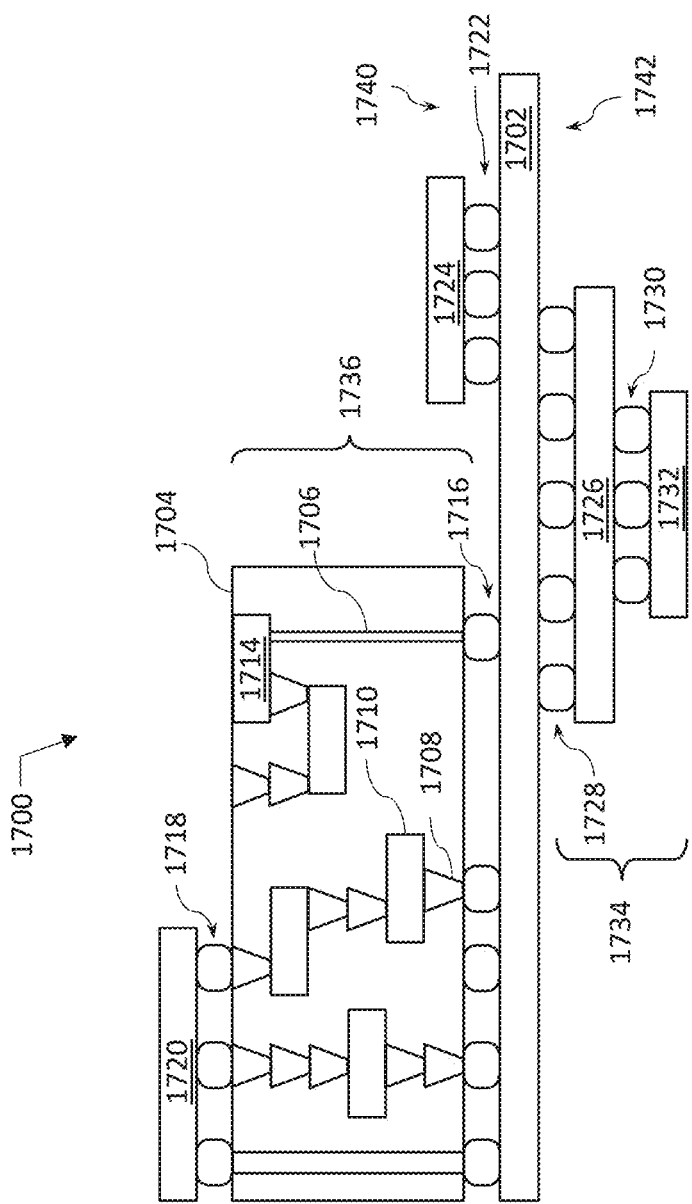
FIG. 17 is a cross-sectional side view of an IC device assembly that may include one or more transistors with front-side and back-side contacts in accordance with any of the embodiments disclosed herein.

FIG. 17 is a cross-sectional side view of an IC device assembly 1700 that may include components having or being associated with (e.g., being electrically connected by means of) one or more IC structures with transistors with front-side and back-side contacts in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the transistors with front-side and back-side contacts, disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 15B), an IC device (e.g., the IC device 1600 of FIG. 16), or any other suitable component. In some embodiments, the IC package 1720 may include one or more transistors with front-side and back-side contacts, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 17, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The interposer 1704 may further include one or more transistors with front-side and back-side contacts, as described herein. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 18:
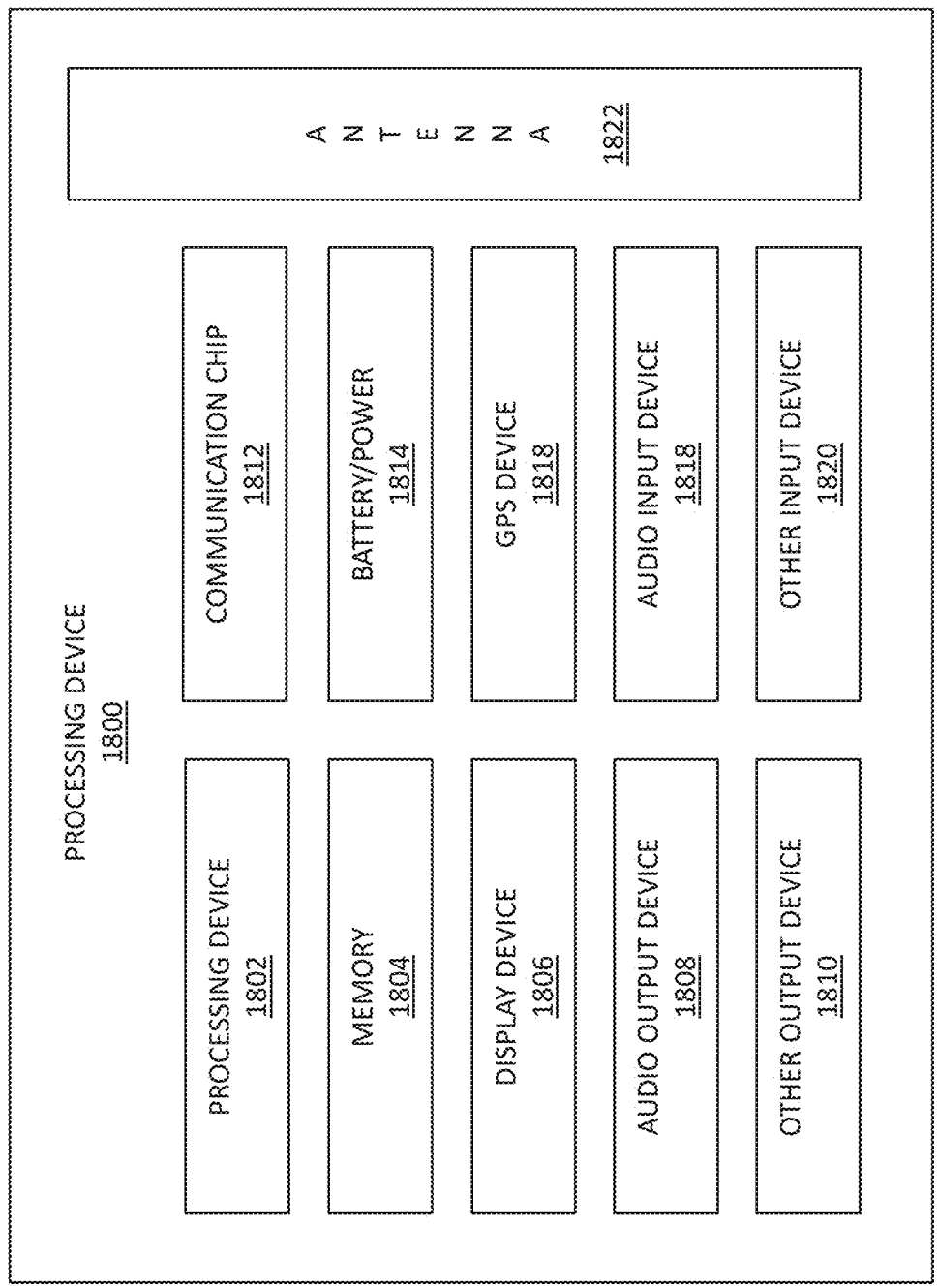
FIG. 18 is a block diagram of an example computing device that may include one or more transistors with front-side and back-side contacts in accordance with any of the embodiments disclosed herein.

FIG. 18 is a block diagram of an example computing device 1800 that may include one or more components including one or more IC structures with one or more transistors with front-side and back-side contacts in accordance with any of the embodiments disclosed herein. For example, any suitable ones of the components of the computing device 1800 may include a die (e.g., the die 1502 of FIG. 15B) having one or more transistors with front-side and back-side contacts as described herein. Any one or more of the components of the computing device 1800 may include, or be included in, an IC device 1600 (FIG. 16). Any one or more of the components of the computing device 1800 may include, or be included in, an IC device assembly 1700 (FIG. 17).

A number of components are illustrated in FIG. 18 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 18, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-M RAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides an IC device that includes a support structure; a channel material having a longitudinal structure; a first S/D region enclosing a first portion of the channel material, the first S/D region having a first face parallel to the support structure and a second face opposite the first face; a gate electrode enclosing a second portion of the channel material; a second S/D region enclosing a third portion of the channel material, the second portion between the first portion and the third portion; a first S/D contact coupled to the first S/D region on the first face; and a second S/D contact coupled to the first S/D region on the second face.

Example 2 provides the IC device according to example 1, where the channel material is a fin, the fin extending in a direction perpendicular to the support structure.

Example 3 provides the IC device according to example 1, where the channel material includes at least one nanoribbon where, in general, the term "nanoribbon" refers to an elongated semiconductor structure such as a nanoribbon or a nanowire, having a long axis parallel to the support structure.

Example 4 provides the IC device according to any of the preceding examples, where the support structure is a dielectric material, and the channel material is disposed within the dielectric material.

Example 5 provides the IC device according to example 4, where the support structure encloses a fourth portion of the channel material, the fourth portion between the first portion and the second portion, and the support structure further encloses a fifth portion of the channel material, the fifth portion between the second portion and the third portion.

Example 6 provides the IC device according to any of the preceding examples, where a distance between the first S/D and the gate is between about 1 nanometer and 10 nanometers including all values and ranges therein, e.g., between about 2 nanometers and 5 nanometers.

Example 7 provides the IC device according to any of the preceding examples, where the channel material is in a layer over the support structure, and the second S/D contact extends through the support structure to the first S/D region.

Example 8 provides the IC device according to any of the preceding examples, the IC device further including a third S/D contact coupled to a first face of the second S/D region and a fourth S/D contact coupled to a second face of the second S/D region.

Example 9 provides the IC device according to any of the preceding examples, the IC device further including a first gate contact coupled to a first face of the gate electrode and a second gate contact coupled to a second face of the gate electrode.

Example 10 provides the IC device according to any of the preceding examples, where the first S/D contact extends in a direction perpendicular to the first face, a first portion of the first S/D contact farther from the first face being wider than a second portion of the first S/D contact nearer to the first face, and the second S/D contact extends in a direction perpendicular to the second face, a first portion of the second S/D contact farther from the second face being wider than a second portion of the second S/D contact nearer to the second face.

Example 11 provides the IC device according to any of the preceding examples, the IC device further including a gate dielectric enclosing the second portion of the channel material, the gate dielectric disposed between the second portion of the channel material and the gate electrode.

Example 12 provides transistor arrangement that includes a structure of a channel material; a first S/D region enclosing a first portion of the structure, the first S/D region having a top face and a bottom face; a gate electrode enclosing a second portion of the structure, the gate electrode having a top face and a bottom face; and a second S/D region enclosing a third portion of the structure, the second S/D region having a top face and a bottom face, where the top faces of the first S/D region, the gate electrode, and the second S/D region are within a first plane, and the bottom faces of the first S/D region, the gate electrode, and the second S/D region are within a second plane.

Example 13 provides the transistor arrangement according to example 12, further including a first S/D contact coupled to the top face of the first S/D region and a second S/D contact coupled to the bottom face of the first S/D region.

Example 14 provides the transistor arrangement according to example 13, further including a third S/D contact coupled to the top face of the second S/D region and a fourth S/D contact coupled to the bottom face of the second S/D region.

Example 15 provides the transistor arrangement according to any of examples 12-14, further including a first gate contact coupled to the top face of the gate electrode and a second gate contact coupled to the bottom face of the gate electrode.

Example 16 provides the transistor arrangement according to any of examples 12-15, where the structure of the channel material includes a plurality of nanoribbons.

Example 17 provides the transistor arrangement according to any of examples 12-16, where the transistor arrangement is partially enclosed by a support structure, the support structure having a top face in the first plane and a bottom face in the second plane.

Example 18 provides a method of fabricating an IC device, the method including forming a channel material embedded in a support structure, the channel material having a longitudinal structure extending in a direction parallel to an upper face the support structure; etching regions of the support structure around a first portion, a second portion, and a third portion of the channel material; forming a first S/D region that encloses the first portion of the channel material; forming a second S/D region that encloses the third portion of the channel material; forming a gate that encloses the second portion of the channel material; forming a first set of contacts on a first side of the first S/D region, the second S/D region, and the gate; and forming a second set of contacts on a second side of the first S/D region, the second S/D region, and the gate, the second side opposite the first side.

Example 19 provides the method according to example 18, further including forming a first interconnect layer over the first set of contacts, the first interconnect layer including conductive material coupled to at least a portion of the first set of contacts; and forming an interconnect layer over the second set of contacts, the second interconnect layer including conductive material coupled to at least a portion of the second set of contacts.

Example 20 provides the method according to example 18, further including grinding at least a portion of the support structure on a side of the support structure opposite the first set of contacts.

Example 21 provides an IC device including a support structure having a front face and a back face; a channel material at least partially enclosed in the support structure; and a plurality of transistors formed in the support structure and along the channel material, one of the transistors including a first S/D region enclosing a first portion of the channel material, a gate electrode enclosing a second portion of the channel material, and a second S/D region enclosing a third portion of the channel material.

Example 22 provides the IC device according to example 21, further including a first interconnect layer on the front face of the support structure and a second interconnect layer on the back face of the support structure.

Example 23 provides the IC device according to example 22, further including a capacitor coupled to the first S/D region via the first interconnect layer, the capacitor and the first transistor forming a memory cell.

Example 24 provides the IC device according to any of examples 21-23, further including first and second S/D contacts coupled to opposite sides of the first S/D region, and third and fourth S/D contacts coupled to opposite sides of the second S/D region.

Example 25 provides the IC device according to any of examples 21-23, further including an S/D contact coupled to the first S/D region, the S/D contact further coupled to an S/D region of a second transistor of the plurality of transistors.

Example 26 provides the IC device according to any of examples 21-25, where the support structure includes a first layer and a second layer, the channel material is at least partially enclosed in the first layer, and at least one contact extends through the second layer and coupled to the first S/D region of the transistor.

Example 27 provides an IC package that includes an IC die, including one or more of the memory/IC devices according to any one of the preceding examples. The IC package may also include a further component, coupled to the IC die.

Example 28 provides the IC package according to example 27, where the further component is one of a package substrate, a flexible substrate, or an interposer.

Example 29 provides the IC package according to examples 27 or 28, where the further component is coupled to the IC die via one or more first level interconnects.

Example 30 provides the IC package according to example 29, where the one or more first level interconnects include one or more solder bumps, solder posts, or bond wires.

Example 31 provides a computing device that includes a circuit board; and an IC die coupled to the circuit board, where the IC die includes one or more of the transistors/IC devices according to any one of the preceding examples (e.g., transistors/IC devices according to any one of examples 1-26), and/or the IC die is included in the IC package according to any one of the preceding examples (e.g., the IC package according to any one of examples 27-30).

Example 32 provides the computing device according to example 31, where the computing device is a wearable computing device (e.g., a smart watch) or hand-held computing device (e.g., a mobile phone).

Example 33 provides the computing device according to examples 31 or 32, where the computing device is a server processor.

Example 35 provides the computing device according to examples 31 or 32, where the computing device is a motherboard.

Example 36 provides the computing device according to any one of examples 31-34, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

What is claimed is:
1. An integrated circuit (IC) device comprising:
a support structure having a face extending in a first direction and in a second direction perpendicular to the first direction;
a channel material having a longitudinal structure;
a first source or drain (S/D) region enclosing a first portion of the channel material, the first S/D region having a first face parallel to the face of the support structure and a second face opposite the first face;
a gate electrode enclosing a second portion of the channel material, the gate electrode having a first face that is coplanar with the first face of the first S/D region and a second face that is coplanar with the second face of the S/D region;
a second S/D region enclosing a third portion of the channel material, the second portion between the first portion and the third portion;
a first S/D contact coupled to the first S/D region on the first face; and
a second S/D contact coupled to the first S/D region on the second face.

2. The IC device of claim 1, wherein the channel material comprises a fin, the fin extending in a direction perpendicular to the support structure.

3. The IC device of claim 1, wherein the channel material comprises at least one nanoribbon.

4. The IC device of claim 1, wherein the support structure comprises a dielectric material, and the channel material is disposed within the dielectric material.

5. The IC device of claim 4, wherein the support structure encloses a fourth portion of the channel material, the fourth portion between the first portion and the second portion, and the support structure further encloses a fifth portion of the channel material, the fifth portion between the second portion and the third portion.

6. The IC device of claim 1, wherein a distance between the first S/D region and the gate is between about 1 nanometer and 10 nanometers.

7. The IC device of claim 1, wherein the channel material is in a layer over the support structure, and the second S/D contact extends through the support structure to the first S/D region.

8. The IC device of claim 1, further comprising:
a third S/D contact coupled to a first face of the second S/D region; and
a fourth S/D contact coupled to a second face of the second S/D region.

9. The IC device of claim 1, further comprising:
a first gate contact coupled to a first face of the gate electrode; and
a second gate contact coupled to a second face of the gate electrode.

10. The IC device of claim 1, wherein the first S/D contact extends in a direction perpendicular to the first face, a first portion of the first S/D contact farther from the first face being wider than a second portion of the first S/D contact nearer to the first face, and the second S/D contact extends in a direction perpendicular to the second face, a first portion of the second S/D contact farther from the second face being wider than a second portion of the second S/D contact nearer to the second face.

11. The IC device of claim 1, further comprising a gate dielectric enclosing the second portion of the channel material, the gate dielectric disposed between the second portion of the channel material and the gate electrode.

12. A transistor arrangement comprising:
an elongated structure comprising a semiconductor material, the elongated structure extending in a horizontal direction;
a first source or drain (S/D) region enclosing a first portion of the elongated structure, the first S/D region having a top face and a bottom face;
a gate electrode enclosing a second portion of the elongated structure, the gate electrode having a top face and a bottom face; and
a second S/D region enclosing a third portion of the elongated structure, the second S/D region having a top face and a bottom face;
wherein the top faces of the first S/D region, the gate electrode, and the second S/D region are within a first plane, and the bottom faces of the first S/D region, the gate electrode, and the second S/D region are within a second plane, wherein the first plane is over the second plane in a vertical direction, the vertical direction perpendicular to the horizontal direction.

13. The transistor arrangement of claim 12, further comprising:
a first S/D contact coupled to the top face of the first S/D region; and
a second S/D contact coupled to the bottom face of the first S/D region.

14. The transistor arrangement of claim 13, further comprising:
a third S/D contact coupled to the top face of the second S/D region; and
a fourth S/D contact coupled to the bottom face of the second S/D region.

15. The transistor arrangement of claim 13, further comprising:
a first gate contact coupled to the top face of the gate electrode; and
a second gate contact coupled to the bottom face of the gate electrode.

16. The transistor arrangement of claim 12, wherein the elongated structure comprises nanoribbon.

17. The transistor arrangement of claim 12, wherein the transistor arrangement is partially enclosed by a support structure, the support structure having a top face in the first plane and a bottom face in the second plane.

18. A method of fabricating an integrated circuit (IC) device, the method comprising:
forming a channel material embedded in a support structure, the channel material having a longitudinal structure extending in a direction parallel to an upper face the support structure;
etching regions of the support structure around a first portion, a second portion, and a third portion of the channel material;
forming a first source or drain (S/D) region that encloses the first portion of the channel material, the first S/D region having a first face and a second face opposite the first face;
forming a second S/D region that encloses the third portion of the channel material, the second S/D region having a first face and a second face opposite the first face;
forming a gate that encloses the second portion of the channel material, the gate having a first face and a second face opposite the first face, wherein the first face of the gate is coplanar with the first face of the first S/D region, and the second face of the gate is coplanar with the second face of the first S/D region;
forming a first set of contacts on the first face of the first S/D region, the first face of the second S/D region, and the first face of the gate; and
forming a second set of contacts on the second face of the first S/D region, the second face of the second S/D region, and the second face of the gate.

19. The method of claim 18, further comprising:
forming a first interconnect layer over the first set of contacts, the first interconnect layer comprising conductive material coupled to at least a portion of the first set of contacts; and
forming an interconnect layer over the second set of contacts, the second interconnect layer comprising conductive material coupled to at least a portion of the second set of contacts.

20. The method of claim 18, further comprising:
grinding at least a portion of the support structure on a side of the support structure opposite the first set of contacts.

* * * * *